(12) United States Patent
Ishimaru et al.

(10) Patent No.: US 8,076,709 B2
(45) Date of Patent: Dec. 13, 2011

(54) NONVOLATILE SEMICONDUCTOR MEMORY DEVICE

(75) Inventors: Tetsuya Ishimaru, Tokyo (JP); Digh Hisamoto, Tokyo (JP); Kan Yasui, Tokyo (JP); Shinichiro Kimura, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/873,679

(22) Filed: Sep. 1, 2010

(65) Prior Publication Data

US 2010/0322013 A1 Dec. 23, 2010

Related U.S. Application Data

(62) Division of application No. 11/030,900, filed on Jan. 10, 2005, now Pat. No. 7,847,331.

(30) Foreign Application Priority Data

Mar. 31, 2004 (JP) ................................. 2004-106850

(51) Int. Cl.
*H01L 29/792* (2006.01)
*G11C 16/04* (2006.01)

(52) U.S. Cl. .................................................... 257/314

(58) Field of Classification Search .......... 257/314–326, 257/E27.078, E29.3–E29.309, E21.179–E21.182, 257/E21.209–E21.21, E21.422, E21.423, 257/E21.679–E21.694; 365/185.01
See application file for complete search history.

(56) References Cited

U.S. PATENT DOCUMENTS

| 5,969,383 | A | 10/1999 | Chang et al. |
| 5,991,204 | A | 11/1999 | Chang |
| 6,051,860 | A | 4/2000 | Odanaka et al. |
| 6,248,633 | B1 | 6/2001 | Ogura et al. |
| 6,255,166 | B1 * | 7/2001 | Ogura et al. ............ 438/257 |
| 6,828,618 | B2 * | 12/2004 | Baker et al. ............ 257/311 |
| 7,053,442 | B2 | 5/2006 | Maemura |

(Continued)

FOREIGN PATENT DOCUMENTS

| JP | 2001-102466 | 4/2001 |
| JP | 2003-046002 | 2/2003 |
| WO | WO 03/012878 A1 | 2/2003 |

OTHER PUBLICATIONS

Ielmini et al., "Experimental and Monte Carlo Analysis of Dain-Avalanche Hot-Hole Injection for Reliability Optimization in Flash Memories," IEEE International Electron Devices Meeting 2003, pp. 157-160.

(Continued)

*Primary Examiner* — Dao H Nguyen
*Assistant Examiner* — Tram H Nguyen
(74) *Attorney, Agent, or Firm* — Miles & Stockbridge P.C.

(57) ABSTRACT

In a situation where a memory cell includes an ONO film, which comprises a silicon nitride film for charge storage and oxide films positioned above and below the silicon nitride film; a memory gate above the ONO film; a select gate, which is adjacent to a lateral surface of the memory gate via the ONO film; a gate insulator positioned below the select gate; a source region; and a drain region, an erase operation is performed by injecting holes generated by BTBT into the silicon nitride film while applying a positive potential to the source region, applying a negative potential to the memory gate, applying a positive potential to the select gate, and flowing a current from the drain region to the source region, thus improving the characteristics of a nonvolatile semiconductor memory device.

20 Claims, 25 Drawing Sheets

U.S. PATENT DOCUMENTS

| | | |
|---|---|---|
| 7,057,230 B2 | 6/2006 | Tanaka et al. |
| 7,268,042 B2 * | 9/2007 | Hisamoto et al. ............. 438/267 |
| 7,339,827 B2 * | 3/2008 | Yasui et al. .............. 365/185.18 |
| 7,759,209 B2 * | 7/2010 | Machida et al. ............. 438/305 |
| 7,847,343 B2 * | 12/2010 | Hisamoto et al. ............. 257/324 |
| 2003/0198086 A1 | 10/2003 | Shukuri |
| 2004/0119107 A1 * | 6/2004 | Hisamoto et al. ............. 257/314 |
| 2004/0166630 A1 * | 8/2004 | Ogura et al. .................. 438/257 |
| 2010/0320524 A1 * | 12/2010 | Shukuri ........................ 257/316 |

OTHER PUBLICATIONS

Taiwanese Office Action dated Apr. 14, 2011, Application No. TW 093133660.

* cited by examiner

FIG. 2

| | Vsg | Vmg | Vs | Vd | Vwell | |
|---|---|---|---|---|---|---|
| PROGRAM (HOT ELECTRON INJECTION) | 0.7 | 10 | 5 | 0 | 0 | PROGRAMMING CURRENT CONTROLLED BY Vsg |
| | 1.5 | 10 | 5 | 0.8 | 0 | PROGRAMMING CURRENT CONTROLLED BY Vd |

| | Vsg | Vmg | Vs | Vd | Vwell | |
|---|---|---|---|---|---|---|
| ERASE (HOT HOLE INJECTION) | 0.7 | -5 | 7 | 0 | 0 | ERASING CHANNEL CURRENT CONTROLLED BY Vsg |
| | 1.5 | -5 | 7 | 0.8 | 0 | ERASING CHANNEL CURRENT CONTROLLED BY Vd |
| | 1.8 | -4 | 8 | 1 | 0 | BREAKDOWN VOLTAGE IMPROVED BY Vd |
| | 0.7 | -6 | 6 | 0 | -1 | BREAKDOWN VOLTAGE IMPROVED BY Vwell |

| | Vsg | Vmg | Vs | Vd | Vwell | |
|---|---|---|---|---|---|---|
| READ | 1.5 | 1.5 | 0 | 1.5 | 0 | REVERSE |
| | 1.5 | 1.5 | 1.5 | 0 | 0 | FORWARD |

FIG. 6

|  | | SGL0 | SGL1~3 | MGL0 | MGL1~3 | SL0 | SL1 | BL0 | BL1 | SELECTED CELLS |
|---|---|---|---|---|---|---|---|---|---|---|
| PROGRAM | | 0.7 | 0 | 10 | 0 | 5 | 0 | 0 | 1.5 | BIT1 |
| ERASE | WORD | 0.7 | 0 | -5 | 0 | 7 | 0 | 0 | 0 | WORD1 |
| | BLOCK | 0.7 | 0.7 | -5 | -5 | 7 | 7 | 0 | 0 | ALL |
| READ | REVERSE | 1.5 | 0 | 1.5 | 0 | 0 | 0 | 1.5 | 0 | BIT1 |
| | FORWARD | 0 | 1.5 | 1.5 | 0 | 1.5 | 1.5 | 1.5 | 0 | BIT1 |

FIG. 7

|  | | SGL0 | SGL1~3 | MGL0 | MGL1~3 | SL0 | SL1 | BL0 | BL1 | SELECTED CELLS |
|---|---|---|---|---|---|---|---|---|---|---|
| PROGRAM | | 1.5 | 0 | 10 | 0 | 5 | 0 | 0.8 | 1.5 | BIT1 |
| ERASE | WORD | 1.5 | 0 | -5 | 0 | 7 | 0 | 0.8 | 0.8 | WORD1 |
| | BLOCK | 1.5 | 0.5 | -5 | -5 | 7 | 7 | 0.8 | 0.8 | ALL |
| READ | REVERSE | 1.5 | 0 | 1.5 | 0 | 0 | 0 | 1.5 | 0 | BIT1 |
| | FORWARD | 0 | 1.5 | 1.5 | 0 | 1.5 | 1.5 | 1.5 | 0 | BIT1 |

FIG. 11

|  |  | SGL0 | SGL1~3 | MGL | SL | BL0 | BL1 | SELECTED CELLS |
|---|---|---|---|---|---|---|---|---|
| PROGRAM | | 0.7 | 0 | 10 | 5 | 0 | 1.5 | BIT1 |
| ERASE | WORD | 0.7 | 0 | -5 | 7 | 0 | 0 | WORD1 |
|  | BLOCK | 0.7 | 1.5 | -5 | 7 | 0 | 0 | ALL |
| READ | REVERSE | 1.5 | 0 | 1.5 | 0 | 1.5 | 0 | BIT1 |
|  | FORWARD | 0 | 1.5 | 1.5 | 1.5 | 1.5 | 0 | BIT1 |

FIG. 12

|  |  | SGL0 | SGL1~3 | MGL | SL | BL0 | BL1 | SELECTED CELLS |
|---|---|---|---|---|---|---|---|---|
| PROGRAM | | 1.5 | 0 | 10 | 5 | 0.8 | 1.5 | BIT1 |
| ERASE | WORD | 1.5 | 0 | -5 | 7 | 0.8 | 0.8 | WORD1 |
|  | BLOCK | 1.5 | 1.5 | -5 | 7 | 0.8 | 0.8 | ALL |
| READ | REVERSE | 1.5 | 0 | 1.5 | 0 | 1.5 | 0 | BIT1 |
|  | FORWARD | 0 | 1.5 | 1.5 | 1.5 | 1.5 | 0 | BIT1 |

FIG. 14

|  |  | SGL0 | SGL1~3 | MGL0 | MGL1~3 | SL0 | SL1 | BL0 | BL1 | SELECTED CELLS |
|---|---|---|---|---|---|---|---|---|---|---|
| PROGRAM | | 0.7 | 0 | 10 | 0 | 0 | 1.5 | 5 | 0 | BIT1 |
| ERASE | WORD | 0.7 | 0 | -5 | 0 | 0 | 0 | 7 | 0 | WORD1 |
| | BLOCK | 0.7 | 1.5 | -5 | -5 | 0 | 0 | 7 | 7 | ALL |
| READ | REVERSE | 1.5 | 0 | 1.5 | 0 | 1.5 | 0 | 0 | 0 | BIT1 |
| | FORWARD | 0 | 1.5 | 1.5 | 0 | 1.5 | 0 | 1.5 | 1.5 | BIT1 |

FIG. 15

|  |  | SGL0 | SGL1~3 | MGL0 | MGL1~3 | SL0 | SL1 | BL0 | BL1 | SELECTED CELLS |
|---|---|---|---|---|---|---|---|---|---|---|
| PROGRAM | | 0.7 | 0 | 10 | 0 | 0 | 1.5 | 5 | 0 | BIT1 |
| ERASE | WORD | 0.7 | 0 | -5 | 0 | 0 | 0 | 7 | 0 | WORD1 |
| | BLOCK | 0.7 | 1.5 | -5 | -5 | 0 | 0 | 7 | 7 | ALL |
| READ | REVERSE | 1.5 | 0 | 1.5 | 0 | 1.5 | 0 | 0 | 0 | BIT1 |
| | FORWARD | 0 | 1.5 | 1.5 | 0 | 1.5 | 0 | 1.5 | 1.5 | BIT1 |

NONVOLATILE SEMICONDUCTOR MEMORY DEVICE

CROSS-REFERENCE TO RELATED APPLICATION

This application is a division of Application Ser. No. 11/030,900 filed Jan. 10, 2005 now U.S. Pat. No. 7,847,331. The present application also claims priority from Japanese application JP 2004-106850 filed on Mar. 31, 2004, the content of which is hereby incorporated by reference into this application.

FIELD OF THE INVENTION

The present invention relates to a nonvolatile semiconductor memory device and more particularly to a nonvolatile semiconductor memory device that is suitable for erase speed enhancement and programming endurance characteristics improvement.

BACKGROUND OF THE INVENTION

EEPROMs (Electrically Erasable and Programmable Read Only Memories) are widely used as a nonvolatile semiconductor memory device that is electrically erasable and programmable. These memory devices, which are represented by a widely used flash memory, have a conductive floating gate surrounded by an oxide or a trap insulator under a MOS (Metal Oxide Semiconductor) transistor gate. They use an electrical charge in the floating gate or trap insulator as stored information and read it as a transistor threshold value. The trap insulator is an insulator that is capable of storing an electrical charge. A typical example of the trap insulator is a silicon nitride film. When an electrical charge is injected into/released from such an electrical charge storage region, the MOS transistor threshold value is shifted so that the functionality of a storage element is exercised. Split gate cell based on a MONOS (Metal-Oxide-Nitride-Oxide-Semiconductor) film is known as a flash memory using a silicon nitride film.

Advantages derived from the use of a silicon nitride film as an electrical charge storage region for the above memory include 1) excellent data retention reliability is provided because an electrical charge is stored discretely, and 2) the top and bottom oxides for the silicon nitride film can be thinned because excellent data retention reliability is provided so that the voltage for programming/erase can be lowered.

Advantages provided by the use of a split gate cell include 1) hot electron injection into the silicon nitride film can be achieved by a source side injection method so as to provide excellent electron injection efficiency and permit high-speed, low-current programming, and 2) the peripheral circuit scale can be rendered small because programming/erase control is exercised with ease.

Two known methods are used for erasing the above memory: tunneling erase method and hot hole injection method. The memory cell based on the tunneling erase method is described, for instance, in Patent Document 1 (Japanese Patent JP-A No. 102466/2001). The memory cell based on the BTBT hot hole injection erase method is described, for instance, in Patent Document 2 (U.S. Pat. No. 5,969,383), Patent Document 3 (U.S. Pat. No. 6,248,633), and Patent Document 4 (Japanese Patent JP-A No. 46002/2003).

When the tunneling erase method is used, by applying electric field to the silicon nitride film, electrons, which are injected into the silicon nitride film by programming, tunnel through the top or bottom oxide to a gate or a substrate.

When the BTBT hot hole injection method is used, on the other hand, the electrons are not extracted. Instead, the threshold value is changed by injecting positively charged holes. As described on pages 157 through 160 of IEEE International Electron Devices Meeting 2003, it is known that hole injection is accomplished by generating holes by means of BTBT (Band-To-Band Tunneling), performing electric field acceleration of the holes, and injecting the holes into an insulator. (see Non-patent Document 1).

[Patent Document 1] Japanese Patent JP-A No. 102466/2001 (equivalent to U.S. Pat. No. 6,255,166)
[Patent Document 2] U.S. Pat. No. 5,969,383
[Patent Document 3] U.S. Pat. No. 6,248,633
[Patent Document 4] Japanese Patent JP-A No. 46002/2003
[Non-patent Document 1] IEEE International Electron Devices Meeting 2003, pp. 157-160

Here, we compare the tunneling erase method and hole injection method (BTBT hot hole injection method). When the tunneling erase method is employed, there is a tradeoff between the data retention characteristic and erase characteristic. To improve the data retention characteristic, it is necessary to increase the thicknesses of oxides on upper and lower side of the silicon nitride film for decreasing electrical charge leakage or the thickness of the silicon nitride film for increasing the number of traps. However, since it is hard to have an electrical charge tunnel through a thick oxide during an erase operation, a low erase speed is lowered. To raise the erase speed, it is necessary to increase the erase voltage. However, an increase in the erase voltage enlarges the scale of a peripheral circuit, thereby increasing the chip cost. The oxide for electron extraction is limited to a small film thickness permitting electron tunneling so that the data retention characteristic is restricted.

Further, since electrons injected for programming are extracted for erase purposes, the threshold value prevailing after erase cannot be lowered below an initial threshold voltage at which the silicon nitride film is electrically neutral. If the threshold value cannot be sufficiently decreased, a large read current cannot be obtained. As a result, it is difficult to provide an increased read speed.

If the hole injection erase method (BTBT hot hole injection erase method) is used, on the other hand, the threshold value prevailing after erase can be shifted from the initial level to the negative side. In other words, since positive charges are injected and stored in an insulator, the threshold value can be smaller than the initial value and negative. This ensures that a larger amount of current can flow. Therefore, the hole injection erase method is suitable for a high-speed operation of a semiconductor circuit. Under these circumstances, the hole injection erase method is highlighted in recent years.

When an erase operation is performed by the positive hole injection erase method (BTBT hot hole injection erase method), a positive voltage is applied to a source diffusion layer of an NMOS-based memory cell and a negative voltage is applied to a gate electrode. Holes generated at the end of the source diffusion layer by means of BTBT can be accelerated by an electric field that is generated by a high voltage applied to the source diffusion layer and gate electrode, and injected into the silicon nitride film for erase purposes.

However, the studies conducted by the inventor of the present invention have revealed that the use of the hole injection erase method (BTBT hot hole injection erase method) accumulates holes because hole injection is locally conducted. This hole accumulation deteriorates the erase characteristic and electrical charge retention characteristic.

When the hole injection erase method is used, the above-mentioned erase characteristic deterioration occurs as described below. When a negative potential is given to the memory gate (MG) while a positive potential is given to the source (MS), the hot holes for erase operation are generated at the end of the source region MS as shown in FIG. 30 and injected into the entire region of a nitride film (SIN), which faces a silicon substrate. As a result, the holes (holes) are accumulated in the nitride film (c in FIG. 30) that is positioned directly above the hole generation section (b in FIG. 30) during the erase operation. FIG. 29 shows a cross section of an essential part that indicates a location at which hot electrons are generated when a nonvolatile semiconductor memory device (flash memory) performs programming. This figure schematically shows how electrons are injected into the charge storage section at the time of programming. FIG. 30 shows a cross section of an essential part that indicates a location at which hot holes are generated when the nonvolatile semiconductor memory device performs an erase. This figure schematically shows how holes are injected into the charge storage section at the time of an erase. The flash memory components shown in FIGS. 29 and 30 are not described herein because they are assigned the same reference numerals as the counterparts that will be described later in conjunction with embodiments of the present invention.

When the holes accumulate, the vertical electric field on the insulator-substrate interface at the end of the source diffusion layer (MS) decreases to decrease the amount of hole generation, thereby bringing the erase operation to a stop. When programming is repeatedly performed, the number of holes stored in the nitride film above the hole generation section increases, and the hole generation process comes to a stop before the electrons injected by programming are completely erased. As a result, the repeated execution of a programming/erase operation is restricted.

Further, the accumulated holes deteriorate the charge retention characteristic. In other words, the electrical charge must be retained by injected electrons in a programming state. However, the BTBT-based hole injection operation generates holes at the end of the source diffusion layer as described earlier. Therefore, if the holes are excessively accumulated directly above the diffusion layer, the holes are locally accumulated even in a programming state. As a result, threshold value changes caused by recombination of holes and electrons are observed as retention characteristic deterioration.

SUMMARY OF THE INVENTION

It is an object of the present invention to enhance the performance and reliability of a nonvolatile semiconductor memory device.

It is another object of the present invention to avoid characteristic deterioration that may be caused by holes accumulated by erase operations.

The above and other objects and features of the present invention will be apparent from the following detailed description of the preferred embodiments and from the accompanying drawings.

Typical aspects of the present invention will now be described briefly.

The present invention injects electrons to neutralize holes accumulated by erase operations.

In one aspect of the present invention, a nonvolatile semiconductor memory device comprises (a) a first semiconductor region and a second semiconductor region, which are formed in a semiconductor substrate; (b) a first conductor and a second conductor, which are formed over the semiconductor substrate between the first and second semiconductor regions, the first conductor being positioned on the first semiconductor region side and the second conductor being positioned on the second semiconductor region side; (c) a first insulator formed between the first conductor and the semiconductor substrate; and (d) a second insulator, which is formed between the second conductor and the semiconductor substrate and provided with an internal charge storage section. In the nonvolatile semiconductor memory device, which (e) injects electrons into the charge storage section and (f) injects holes into the charge storage section, a charge neutralization operation is performed by injecting electrons in accordance with hole injection.

In another aspect of the present invention, a nonvolatile semiconductor memory device comprises (a) a first semiconductor region and a second semiconductor region, which are formed in a semiconductor substrate; (b) a first conductor and a second conductor, which are formed over the semiconductor substrate between the first and second semiconductor regions, the first conductor being positioned on the first semiconductor region side and the second conductor being positioned on the second semiconductor region side; (c) a first insulator formed between the first conductor and the semiconductor substrate; and (d) a second insulator, which is formed between the second conductor and the semiconductor substrate and provided with an internal charge storage section. The nonvolatile semiconductor memory device (e) performs an erase by applying a potential having a first polarity, which is either positive or negative, to the second semiconductor region, applying a potential having a second polarity, which is the reversal of the first polarity, to the second conductor, and applying a potential having the same polarity as the first polarity to the first conductor in order to inject a first carrier, which has the same polarity as the first polarity, into the charge storage section.

In another aspect of the present invention, a nonvolatile semiconductor memory device comprises (a) a first semiconductor region and a second semiconductor region, which are formed in a semiconductor substrate; (b) a first conductor and a second conductor, which are formed over the semiconductor substrate between the first and second semiconductor regions; (c) a first insulator formed between the first conductor and the semiconductor substrate; and (d) a second insulator, which is formed between the second conductor and the semiconductor substrate and provided with an internal charge storage section. The nonvolatile semiconductor memory device (e) performs an erase by injecting carriers (holes), which are generated by band-to-band tunneling, into the charge storage section while a current flows to the first and second semiconductor regions.

In another aspect of the present invention, a nonvolatile semiconductor memory device comprises an array of a plurality of memory cells, each of which comprising (a) a first semiconductor region and a second semiconductor region, which are formed in a semiconductor substrate; (b) a first conductor and a second conductor, which are formed over the semiconductor substrate between the first and second semiconductor regions; (c) a first insulator formed between the first conductor and the semiconductor substrate; and (d) a second insulator, which is formed between the second conductor and the semiconductor substrate and provided with an internal charge storage section. Further, the nonvolatile semiconductor memory device (e) includes a plurality of first lines and second lines. Each first line connects the first conductor of the memory cells arranged in a first direction. Each second line connects the first conductor region positioned on the first conductor side of the memory cells arranged in a second direction, which is perpendicular to the first direction. The nonvolatile semiconductor memory device (f) performs an erase by injecting first carriers, which have the same polarity as the first polarity and are generated by band-to-band tunneling, into the charge storage section of a selected memory cell while a potential having a first polarity, which is either positive or negative, is applied to the first line that is connected to the memory cell selected out of the plurality of memory cells.

In another aspect of the present invention, a nonvolatile semiconductor memory device comprises an array of a plurality of memory cells, each of which comprising (a) a first semiconductor region and a second semiconductor region, which are formed in a semiconductor substrate; (b) a first conductor and a second conductor, which are formed over the semiconductor substrate between the first and second semiconductor regions; (c) a first insulator formed between the first conductor and the semiconductor substrate; and (d) a second insulator, which is formed between the second conductor and the semiconductor substrate and provided with an internal charge storage section. Further, the nonvolatile semiconductor memory device (e) includes a plurality of first lines, second lines, and third lines. Each first line connects the first conductor of the memory cells arranged in a first direction. Each second line connects the second conductor region positioned on the second conductor side of the memory cells arranged in a second direction, which is perpendicular to the first direction. Each third line connects the first semiconductor region of the memory cells arranged in the first direction. The nonvolatile semiconductor memory device (f) performs an erase by injecting first carriers, which have the same polarity as the first polarity and are generated by band-to-band tunneling, into the charge storage section of a selected memory cell while a potential having a first polarity, which is either positive or negative, is applied to the first line that is connected to the memory cell selected out of the plurality of memory cells.

In another aspect of the present invention, a nonvolatile semiconductor memory device comprises (a) a first semiconductor region and a second semiconductor region, which are formed in a semiconductor substrate; (b) a first conductor and a second conductor, which are formed over the semiconductor substrate between the first and second semiconductor regions, the first conductor being positioned on the first semiconductor region side and the second conductor being positioned on the second semiconductor region side; (c) a first insulator formed between the first conductor and the semiconductor substrate; and (d) a second insulator, which is formed between the second conductor and the semiconductor substrate and provided with an internal charge storage section. The nonvolatile semiconductor memory device injects electrons into the charge storage section during a programming operation by (e) applying a positive potential to the second conductor, applying a positive potential to the second semiconductor region, and applying a positive potential to the first conductor, and by (f) applying a positive potential to the second conductor, applying a potential of 0 V or a positive potential lower than that for the second conductor to the second semiconductor region, and applying a potential equal to or lower than that for the first semiconductor region to the first conductor.

In still another aspect of the present invention, a nonvolatile semiconductor memory device comprises (a) a first semiconductor region and a second semiconductor region, which are formed in a semiconductor substrate; (b) a first conductor and a second conductor, which are formed over the semiconductor substrate between the first and second semiconductor regions, the first conductor being positioned on the first semiconductor region side and the second conductor being positioned on the second semiconductor region side; (c) a first insulator formed between the first conductor and the semiconductor substrate; and (d) a second insulator, which is formed between the second conductor and the semiconductor substrate and provided with an internal charge storage section. The nonvolatile semiconductor memory device injects electrons into the charge storage section during an erase operation by (e) applying a negative potential to the second conductor, applying a positive potential to the second semiconductor region, and applying a positive potential to the first conductor in order to inject holes into the charge storage section, and by (f) applying a positive potential to the second conductor, applying a potential of 0 V or a positive potential lower than that for the second conductor to the second semiconductor region, and applying a potential equal to or lower than that for the first semiconductor region to the first conductor.

Typical advantages provided by the present invention will now be described briefly.

Carriers (electrons) having a polarity opposite that of carriers (holes) accumulated by erase operations are injected into the carriers (holes) accumulated by erase operations in order to neutralize an electrical charge and obtain an excellent element characteristic.

Further, the performance and reliability of a nonvolatile semiconductor memory device can be enhanced. Particularly, it is possible to increase the erase speed and improve the programming/erasing endurance characteristics. It is also possible to increase the read speed and improve the data retention characteristic.

BRIEF DESCRIPTION OF THE DRAWINGS

FIG. 2 shows tables illustrating the conditions for applying a voltage to various parts of a selected memory cell when a nonvolatile semiconductor memory device according to one embodiment of the present invention performs a programming, erase, or read operation;

FIG. 6 shows a table illustrating the conditions for applying a voltage to various lines when the memory array shown in FIG. 5 performs a programming, erasing, or reading operation;

FIG. 7 shows a table illustrating the conditions for applying a voltage to various lines when the memory array shown in FIG. 5 performs a programming, erasing, or reading operation;

FIG. 11 shows a table illustrating the conditions for applying a voltage to various lines when the memory array shown in FIG. 10 performs a programming, erasing, or reading operation;

FIG. 12 shows a table illustrating the conditions for applying a voltage to various lines when the memory array shown in FIG. 10 performs a programming, erasing, or reading operation;

FIG. 14 shows a table illustrating the conditions for applying a voltage to various lines when the memory array shown in FIG. 13 performs a programming, erasing, or reading operation;

FIG. 15 shows a table illustrating the conditions for applying a voltage to various lines when the memory array shown in FIG. 13 performs a programming, erasing, or reading operation;

DETAILED DESCRIPTION OF THE PREFERRED EMBODIMENTS

Figure 1:
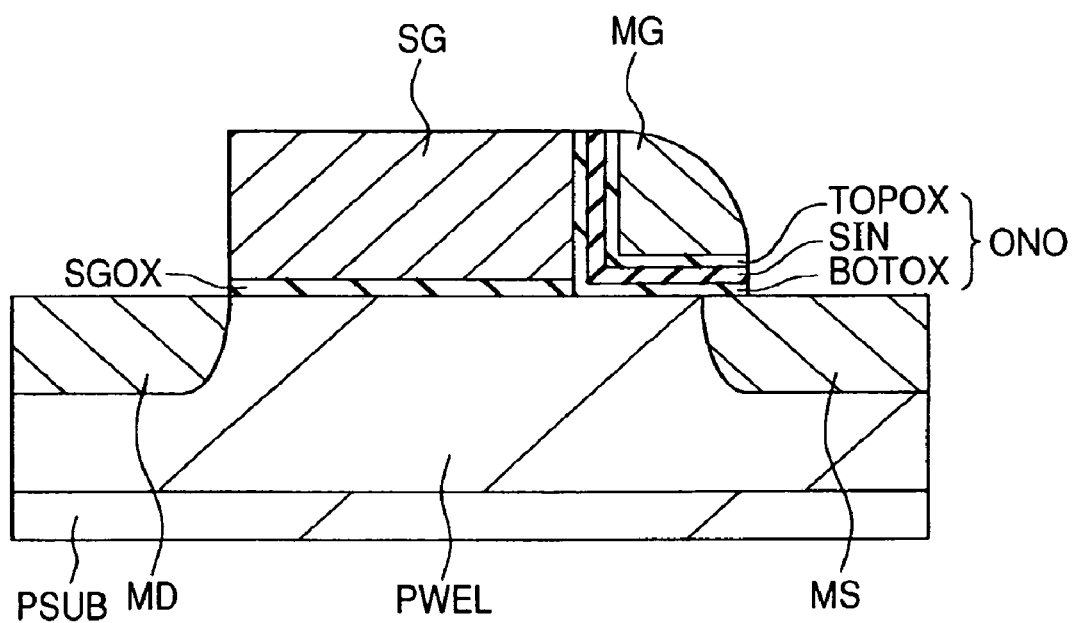
FIG. 1 is a cross-sectional view illustrating an essential part of a nonvolatile semiconductor memory device (flash memory) according to one embodiment of the present invention.

Embodiments of the present invention will now be described with reference to the accompanying drawings. Elements having the same functions are assigned the same reference numerals in all the drawings depicting the embodiments, and will not be repeatedly described. In the following description of the embodiments, identical or similar portions will not be repeatedly described unless necessary.

The present invention uses a trap type insulator (insulation film that can store an electrical charge) for a charge storage section. Therefore, the following description of the embodiments assumes the use of a memory cell that employs a trap type insulator based on an NMOS (n-channel MOS) transistor. The polarities (application voltage polarity and carrier polarity for programming, erasing, or reading) designated in the following embodiments are used in order to describe operations of a memory cell that is based on an NMOS (n-channel MOS) transistor. If the memory cell is based on a PMOS (p-channel MOS) transistor, the same operation can be theoretically obtained by reversing all the polarities of applied potentials and carrier conductivity types.

(1) A nonvolatile semiconductor memory device (flash memory) according to the present invention will now be described.

FIG. 1 is a cross-sectional view illustrating an essential part of a nonvolatile semiconductor memory device (flash memory) according to the present embodiment of the present invention.

The illustrated flash memory is a split gate cell that uses an MONOS film.

As shown in FIG. 1, the memory cell includes a silicon nitride film (nitride film) SIN (that is, a charge storage section); an ONO film (ONO) comprising stacked films, which are oxide films (silicon oxide films) BOTOX, TOPOX above and below the silicon nitride film; a memory gate MG, which comprises an n-type polysilicon or other similar conductor; a select gate SG, which comprises an n-type polysilicon or other similar conductor; a gate insulator SGOX, which is positioned below the select gate SG; a source region (source diffusion layer, n-type semiconductor region) MS, which comprises a semiconductor region (silicon region) into which an n-type impurity is introduced; and a drain region (drain diffusion layer, n-type semiconductor region) MD, which comprises a semiconductor region (silicon region) into which an n-type impurity is introduced. The source region MS and drain region MD are formed in a p-type well region PWEL that is positioned on a p-type silicon substrate (semiconductor substrate) PSUB.

A MOS transistor (MISFET: Metal Insulator Semiconductor Field Effect Transistor) comprising the memory gate MG is referred to as a memory transistor. A MOS transistor (MISFET: Metal Insulator Semiconductor Field Effect Transistor) comprising the select gate SG is referred to as a select transistor.

The programming, erasing, or reading operations will now be described. The employed definition is such that "programming" refers to electron injection into the silicon nitride film SIN and that "erasing" refers to hole injection into the silicon nitride film SIN. The erasing operation, programming operation, and reading operation according to the present embodiment will now be described.

(1-1) First, an erasing method will be described. FIG. 2 illustrates the conditions for applying a voltage to various parts of a selected memory cell when a programming, erasing, or reading operation is performed in accordance with the present embodiment. The subsequent description is given with reference to a memory cell that is formed with a so-called MOSFET 0.25-micron generation process/device technology to provide typical operating voltage conditions. In other words, the employed select transistor has a gate length of 0.2 μm and operates on 1.5 V. The memory cell channel width is 0.25 μm.

As indicated in an upper portion of the "Erasing" area in FIG. 2, control is exercised at the time of an erase so as to apply a voltage Vmg of −5 V to the memory gate MG, a voltage Vs of 7 V to the source region MS, a voltage Vd of 0 V to the drain region MD, and a voltage Vsg to the select gate SG for reversing the select transistor channel surface. If, for instance, the threshold value (select transistor threshold voltage) is 0.4 V, the voltage Vsg of the select gate SG should be approximately 0.7 V. A voltage of 0 V (Vwell) is applied to the well.

As described above, at the time of an erase operation, a positive voltage (Vs>0) is applied to the source region MS. A negative voltage (Vmg<0), which has a polarity opposite that of the voltage (positive voltage) applied to the source region MS, is applied to the memory gate MG. A voltage for reversing the select transistor channel surface, that is, a positive voltage (Vsg>0), which is equal in polarity to the voltage applied to the source region MS, is applied to the select gate SG. Further, the voltage applied to the drain region MD is lower than the voltage applied to the select gate SG and the voltage applied to the source region MS (Vd<Vsg, Vd<Vs).

When the erase method according to the present embodiment is used, the moment an erase is performed by injecting holes carriers having a positive polarity) generated by BTBT (Band-To-Band Tunneling) into the silicon nitride film SIN (that is, when holes generated by BTBT are injected into the silicon nitride film SIN to perform an erase), a channel current flows between the source and drain (between the source region MS and drain region MD) via the select transistor reverse layer. When a higher potential is applied to the source compared to that applied to the well, the depletion layer width w between the substrate and well increases as expressed as $w=(2\epsilon_{Si}\epsilon_0(V_{SB}+\phi_B)/(q\times N_{well}))^{0.5}$ through the use of one-sided step junction approximation. The symbols $\epsilon_{Si}$ and $\epsilon_0$ represent silicon relative permittivity and vacuum permittivity, respectively. The symbol $V_{SB}$ represents the bias between source and well. The symbol $\phi_B$ represents the well's Fermi potential. The symbol q represents an electron charge amount. The symbol $N_{well}$ represents the well's impurity density. Therefore, while the memory gate length is smaller than the depletion layer width w, the depletion layer width increases in the substrate so that the carriers reversely retained on the select transistor channel surface can be drifted toward the source side due to the charge injected into the memory gate and the insulator even if holes are accumulated on the substrate surface. This corresponds to a phenomenon in which a current flows in a memory transistor section due to the short channel effect. Electrons (carriers having a negative polarity) entering the electric field region of the source diffusion layer (source region MS) are accelerated and injected into the silicon nitride film (SIN) above the source diffusion layer in which holes are accumulated. It is therefore possible to annihilate accumulated holes and maintain the electric field of the substrate surface. Consequently, hole generation can be continued by means of BTBT. Further, the electrons accelerated in the electric field generate electron-hole pairs due to impact ionization. Since the generated secondary carriers are widely injected into the charge retention region, the erase process can be accelerated. When the entire injection is considered, however, it is necessary to reduce the threshold voltage for hole injection as compared to electron injection. If, for instance, the junction breakdown voltage between the source diffusion layer and well is BVbs and the value Vs deviates from BVbs by 1 V, excessive electron injection occurs. Therefore, the threshold voltage increases without regard to the erase operation. In the present embodiment, holes are referred to as carriers having a positive polarity whereas electrons are referred to as carriers having a negative polarity (carriers having a polarity opposite that of the holes).

Further, since the holes generated by BTBT and impact ionization lower the junction barrier between the drain and well in the above operation, a bipolar operation is invoked to use the drain, well, and source as an emitter, base, and collector, respectively. Consequently, a large amount of current is consumed. To effectively avoid this problem, a bias should be applied in order to maintain the drain-well junction barrier high. The "Erase" area in FIG. 2 shows erase settings in the case of applying the voltage to the drain or the well (which respectively correspond to the third and fourth lines in the "Erase" area in FIG. 2).

Further, the voltage applied to the drain can be automatically adjusted by means of circuitry to prevent the current flow in the select transistor from becoming excessive. In other words, the circuitry can be automatically controlled so that the value of the current (channel current) flowing between the source region MS and drain region MD is constant. For automatic control purposes, the same circuit as that is used for constant channel current programming should be used as described with reference to programming.

Figure 29:
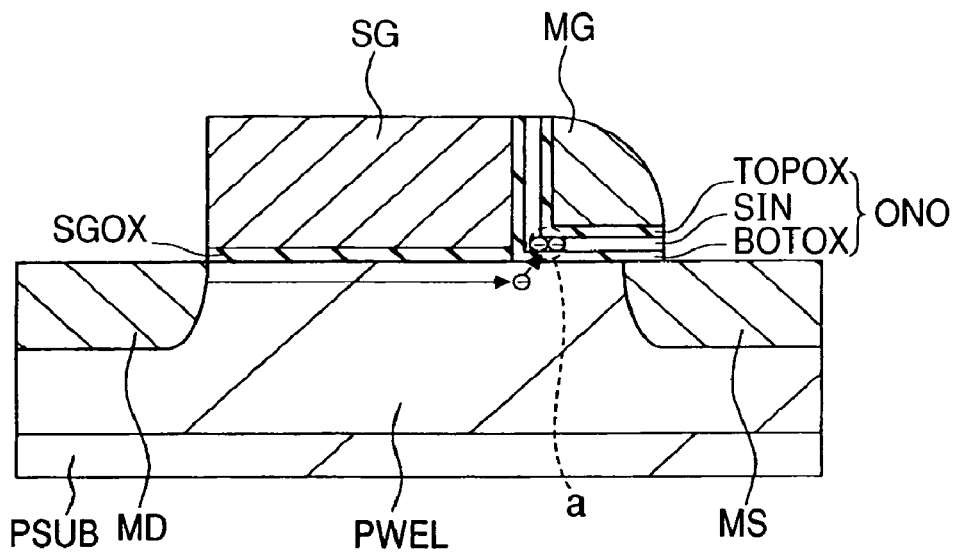
FIG. 29 is a cross-sectional view of an essential part of a substrate, which illustrates the problems to be solved by the present invention by indicating a location at which hot electrons are generated when a nonvolatile semiconductor memory device performs programming.
Figure 30:
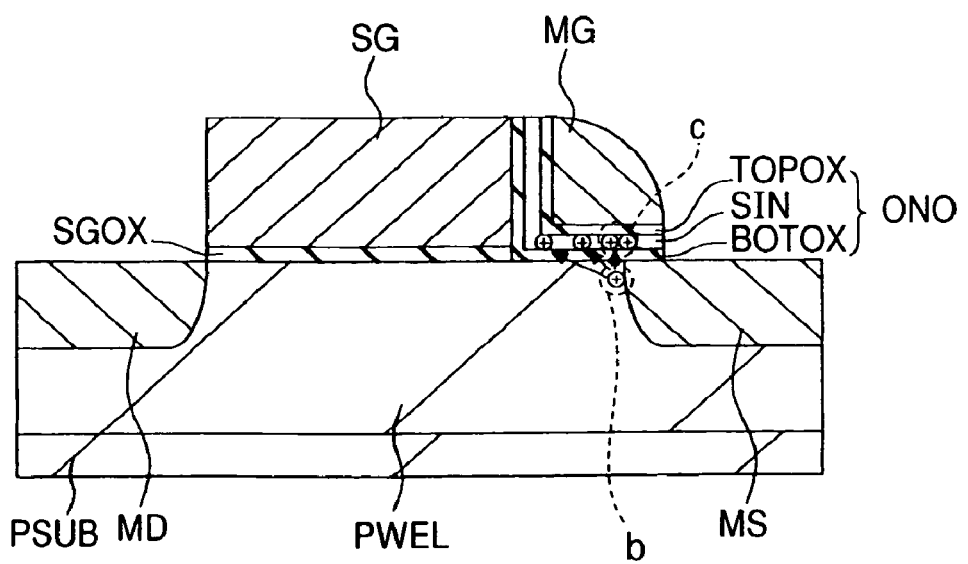
FIG. 30 is a cross-sectional view of an essential part of a substrate, which illustrates the problems to be solved by the present invention by indicating a location at which hot electrons are generated when a nonvolatile semiconductor memory device performs an erase.

When the above voltage (erase voltage) is applied, the holes generated at the end of the source diffusion layer by BTBT (Band-To-Band Tunneling) depending on the voltage applied between the source region MS and memory gate MG are accelerated by a high voltage applied between the source region MS and memory gate MG to become hot holes and then injected into the silicon nitride film SIN, as shown in FIG. 30. The injected holes are captured by a trap in the silicon nitride film so that the memory transistor threshold voltage (threshold value) decreases. The hot holes are injected not only into a section (section a in FIG. 29) near the end toward the select gate SG in the silicon nitride film SIN into which electrons are injected for programming, but also into the entire region of the nitride film (silicon nitride film SIN) facing the silicon substrate. The holes are then accumulated in the silicon nitride film SIN (section c in FIG. 30) above a location where holes are generated by BTBT (near the end of the source region MS, section b in FIG. 30).

Figure 31:
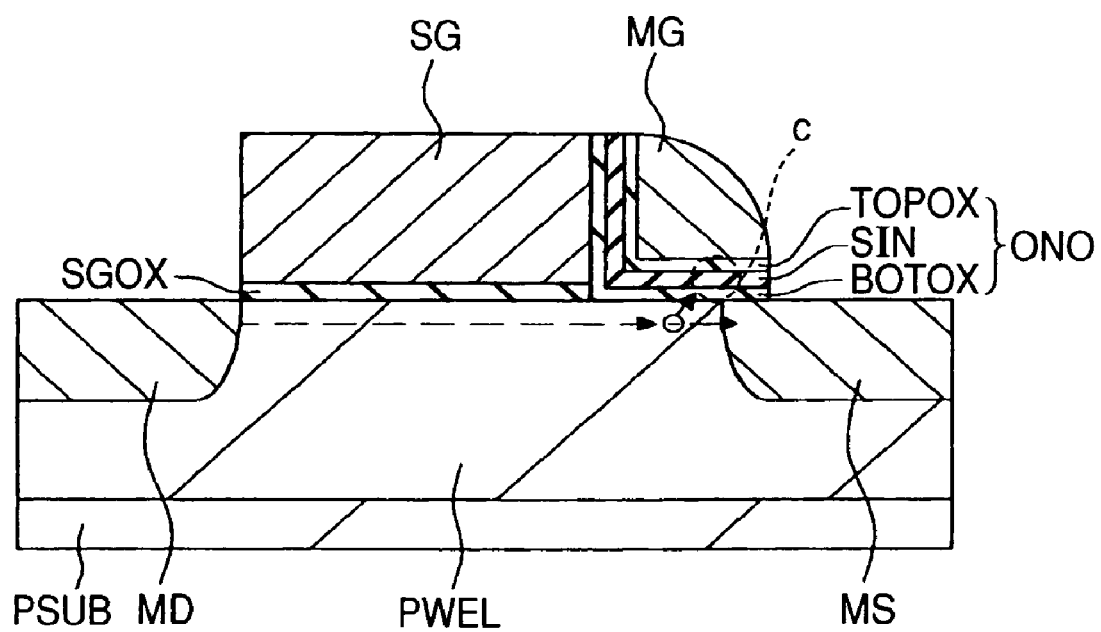
FIG. 31 is a cross-sectional view of an essential part of a memory cell, which illustrates the advantages of the present invention by schematically depicting an electrical charge that prevails when an erase potential is applied to a nonvolatile semiconductor memory device.

FIG. 31 is a cross-sectional view of an essential part of a memory cell of the nonvolatile semiconductor memory device (flash memory). It schematically illustrates how electrons move when an erase potential (a potential indicated in the "Erase" area in FIG. 2) is applied. This cross-sectional view correlates with FIGS. 1, 29, and 30. Electrons flowing on the aforementioned channel are accelerated by a high electric field that is generated in the direction of the channel at the end of the source region MS to which a high voltage is applied. If holes are accumulated in the silicon nitride film above a location at which holes are generated by BTBT (section b in FIG. 30), the electrons are attracted by a vertical electric field generated by the accumulated holes as indicated in FIG. 31, and injected into the hole storage section (section c in FIGS. 30 and 31) in the silicon nitride film SIN. Since the electron injection position corresponds to the hole storage section (section c in FIGS. 30 and 31) of the silicon nitride film SIN, the electrons are injected into the silicon nitride film SIN above and near the end of the source region MS.

In other words, when an erase operation is performed, the holes generated by BTBT as shown in FIG. 30 are injected into the silicon nitride film at the same time the electrons flowing on a channel are injected into the hole storage section of the silicon nitride film SIN.

The hole storage amount can be reduced by injecting electrons into the hole storage section as described above. Therefore, it is possible to inhibit the vertical electric field strength prevailing at the end of the source diffusion layer (source region MS) from being decreased by hole accumulation and the hole generation amount from being decreased by BTBT.

Figure 3:
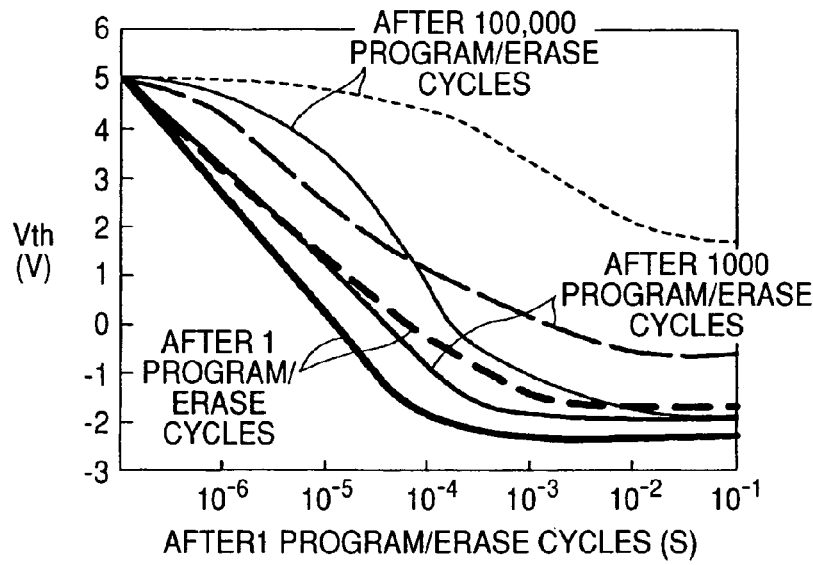
FIG. 3 is a graph illustrating an erase characteristic.

FIG. 3 is a graph illustrating the erase characteristic. This figure relates to the BTBT hot hole erase method (corresponding to the present embodiment) in which a current flows to a channel (depicted by solid lines in the graph in FIG. 3) and the BTBT hot hole erase method (corresponding to the conventional example for comparison) in which no current flows to a channel (depicted by broken lines in the graph in FIG. 3). The figure illustrates the erase characteristic prevailing after programming/erasing cycles have been performed once, the erase characteristic prevailing after programming/erasing cycles have been performed 1000 times, and the erase characteristic prevailing after programming/erasing cycles have been performed 100,000 times. The horizontal axis of the graph shown in FIG. 3 corresponds to the erase time (erase voltage application time), whereas the vertical axis of the graph in FIG. 3 corresponds to the memory transistor threshold voltage (threshold value) Vth.

When electrons are injected into the hole storage section of the silicon nitride film SIN with a current flowing to a channel during an erase operation as described in conjunction with the present embodiment, the amount of hole generation by BTBT is inhibited from decreasing as is obvious from FIG. 3. Therefore, the resulting erase speed is higher than that in the use of the BTBT hot hole erase method in which no current flows to a channel during an erase operation (conventional example for comparison).

Further, when programming/erasing is repeatedly performed during the use of the BTBT hot hole erase method in which no current flows to a channel (conventional example for comparison), the amount of hole storage in the nitride film SIN (section c in FIGS. 30 and 31) above the hole generation section (near the end of the source region MS, section b in FIG. 30) increases, thereby decreasing the erase speed. Hole generation stops before the electrons injected into the silicon nitride film SIN during programming (electrons in section a in FIG. 29) are completely erased. Therefore, the threshold voltage, which can be lowered by an erase, increases (that is, the threshold voltage prevailing after an erase increases while the number of programming/erasing cycles increases), thereby limiting the number of programming/erasing cycles.

If electrons are injected into the hole storage section (section c in FIGS. 30 and 31) of the silicon nitride film SIN with a current flowing to a channel during an erase operation as described in conjunction with the present embodiment, the amount of hole storage can be reduced at each programming/erasing cycle. Therefore, the erase speed can be inhibited from being decreased by programming/erasing. Further, the threshold voltage, which can be lowered by an erase, does not substantially increase (that is, the threshold voltage prevailing after an erase does not substantially change even if the number of programming/erasing cycles increases). As a result, the number of programming/erasing cycles can be increased.

As described earlier, if the memory gate length is increased, a current flows to a channel even when a negative voltage is applied to the memory gate MG. However, a current also flows to a channel when an n-type channel region is provided under the memory gate MG.

It is more preferable that the current flowing to a channel during an erase (the current flowing between the source region MS and drain region MD) be approximately between 0.1 µA and 10 µA as is the case with programming. The power supply circuit can be effectively used when the amount of current is the same as for programming.

A current may be allowed to flow to a channel after the above-mentioned hole storage amount is increased without flowing any current to the channel at the beginning of an erase operation. In other words, an alternative is to supply a positive potential (e.g., 7 V) to the source region MS and a negative potential (e.g., −5 V) to the memory gate MG, start injecting holes into the silicon nitride film SIN (without invoking a current flow to the channel, for instance, by setting the potential Vsg of the select gate SG to 0 V), start supplying a positive potential (e.g., 0.7 V) to the select gate SG after a predetermined period of time in order to reverse the select transistor channel surface, and start flowing a current (channel current) between the source region MS and drain region MD. Since no excessive current flows, the current supply capacity of the power supply circuit can be effectively used. This is effective if a current (channel current) starts flowing between the source region MS and drain region MD when a period of 1 µsec (1 microsecond) or longer elapses after the start of hole injection into the silicon nitride film SIN, and more effective if a current (channel current) starts flowing between the source region MS and drain region MD when a period of 10 µsec (10 microseconds) or longer elapses after the start of hole injection into the silicon nitride film SIN.

When an erase operation is repeated in a memory cell according to the present embodiment, holes are accumulated in the silicon nitride film SIN (section c in FIGS. 30 and 31) above the source diffusion layer (source region MS) so that the charge retention characteristic deteriorates. This deterioration can be avoided by tunnel-injecting electrons into the hole storage section of the silicon nitride film SIN to perform a hole neutralization procedure (accumulated hole neutralization procedure) for hole neutralization purposes. In the hole neutralization procedure, a positive potential is given to the memory gate MG while the source region MS is maintained at a ground potential. Therefore, the source diffusion layer (source region MS) tunnel-injects electrons into the hole storage section (section c in FIGS. 30 and 31) of the silicon nitride film SIN, which is directly above the source diffusion layer (source region MS). In this instance, the accumulated holes have a strong positive potential. Therefore, a great electric field can be obtained at an effective interface, which governs the tunnel current, without giving a high potential to the memory gate MG. It is assumed that the voltage application conditions for the hole neutralization procedure are established so as to apply a voltage of 10 V to the memory gate MG, a voltage of 0 V to the source region MS, a voltage of 0 V to the select gate SG, and a voltage of 0 V to the drain region MD.

Figure 4:
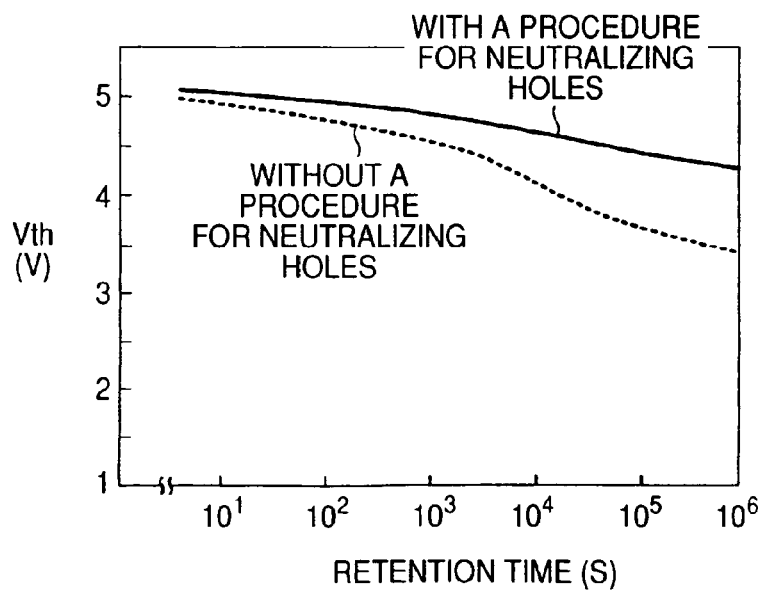
FIG. 4 is a graph illustrating the memory cell programming side charge retention characteristic, which varies depending on whether a hole neutralization operation is performed in a memory cell where programming/erase is repeated by a BTBT hot hole erase method with a current flowing to a channel.

FIG. 4 is a graph that comparatively shows the programming side charge retention characteristic of a memory cell, which prevails in a memory cell in which a programming/erasing operation is repeatedly performed by the above erase method (BTBT hot hole erase method in which a current flows to a channel) and varies depending on whether a hole neutralization procedure is performed. The graph in FIG. 4 shows a charge retention characteristic prevailing when a stored hole neutralization procedure is performed after repeating a programming/erasing operation 10,000 times (indicated by a solid line in the graph in FIG. 4) and a charge retention characteristic prevailing when the stored hole neutralization procedure is not performed after repeating a programming/erasing operation 10,000 times (indicated by a broken line in the graph in FIG. 4). The horizontal axis of the graph in FIG. 4 corresponds to the charge retention time (elapsed time after programming) whereas the vertical axis of the graph in FIG. 4 corresponds to the memory transistor threshold voltage (threshold value) Vth. As is obvious from FIG. 4, the threshold value change amount can be decreased by performing the hole neutralization procedure. Although the description given herein assumes that a single memory cell is used, the stored hole neutralization procedure can work more effectively in a memory array programming/erase operation as detailed later with reference to an array operation.

The above erase operation can be applied to a memory cell that is based on an NMOS (n-channel MOS) transistor as described above (the source region MS and drain region MD are formed by an n-type semiconductor region in this instance). It is preferred that a nonvolatile semiconductor memory device be formed by a memory cell based on an NMOS (n-channel MOS) transistor. The reason is that a high-performance nonvolatile semiconductor memory device can be formed. If the memory cell is alternatively based on a PMOS (p-channel MOS) transistor (the source region MS and drain region MD are formed by a p-type semiconductor region in this instance), the same erase operation can be theoretically obtained by reversing all the polarities of applied potentials and carrier (hole or electron) conductivity types. In other words, if the employed memory cell is based on a PMOS transistor, an erase operation is performed by applying a negative potential (Vs<0; e.g., Vs=−7 V) to the source region MS, applying a positive potential (Vmg>0; e.g., Vmg=5 V) to the memory gate MG, applying a potential for reversing the select transistor channel surface, that is, a negative potential (Vsg<0; e.g., Vsg=−0.7 V), to the select gate SG, and applying a higher potential than for the select gate SG and source region MS (Vd>Vsg, Vd>Vs; e.g., Vd=0 V) to the drain region MD. The electrons generated by BTBT are then injected into the silicon nitride film SIN to perform an erase. At the same time, a channel current (the current formed by the move of holes) flows between the source and drain (between the source region MS and drain region MD) via the reverse layer of the select transistor. The holes entering the electric field of the source diffusion layer (MS) are accelerated and then injected into the silicon nitride film (SIN) above the source diffusion layer on which electrons are accumulated. Consequently, the accumulated electrons can be annihilated.

(1-2) Next, the programming method will be described. For programming, a hot electron programming method, which is a so-called source side injection method, is employed.

As indicated in the upper line of the "Program" area in FIG. 2, control is exercised during programming so as to apply a voltage Vs of 5 V to the source region MS, a voltage Vmg of 10 V to the memory gate MG, a voltage Vd of 0 V to the drain region MD, and a voltage Vsg to the select gate SG in order to provide a channel current in accordance with a setting for programming. Voltage Vsg is determined by the current setting and select transistor threshold value (threshold voltage). If, for instance, the current setting is 1 µA, voltage Vsg is approximately 0.7 V. A voltage of 0 V (Vwell) is applied to the well.

Under the above voltage conditions, the channel current for programming is set in accordance with the voltage Vsg to be applied to the select gate SG. Alternatively, however, the channel current may be set with voltage Vd while voltage Vsg is set to 1.5 V. Voltage Vd is also determined according to the channel current setting and select transistor threshold voltage. If, for instance, the current setting is 1 µA, voltage Vd is approximately 0.8 V (see the lower line of the "Program" area in FIG. 2).

Under the above two conditions, programming is performed with a constant voltage applied. The current flowing to a channel during programming is determined according to the select transistor threshold voltage and the potential difference between the select gate SG and drain region MD. If the select transistor threshold voltage varies, the channel current also varies, thereby causing the programming speed to vary accordingly. Voltage Vd may be adjusted by automatically controlling the circuitry to provide a preselected channel current for the purpose of inhibiting the programming speed from varying. Constant channel current programming can be performed by using a circuit method that is described on pages 211 and 212 of 2003 IEEE VLSI Circuits Symposium Preliminary Reports, which is a publicly known document.

The channel current for programming is approximately between 0.1 and 10 µA. The programming speed increases in proportion to the channel current. However, an increase in the channel current increases the power supply area or decreases the number of bits to be simultaneously written.

Hot electrons are generated in a channel region that is positioned below and between two gates (MG and SG), and locally injected into only the select transistor side of the silicon nitride film SIN below the memory gate MG (see section a in FIG. 29). The injected electrons are captured by a trap in the silicon nitride film SIN. As a result, the memory transistor threshold voltage (threshold value) increases. Electron distribution is such that a peak exists near the end of the select gate SG in the silicon nitride film SIN.

(1-3) Next, the read method will be described. Two read modes are used: reverse and forward. A reverse read is performed in a direction opposite that of source-drain voltage programming. A forward read is performed in the same direction as in source-drain voltage programming.

As shown in the upper line of the "Read" area in FIG. 2, a reverse read is performed by applying a voltage Vd of 1.5 V to the drain region MD, a voltage Vs of 0 V to the source region MS, a voltage Vsg of 1.5 V to the select gate SG, and a voltage Vmg of 1.5 V to the memory gate MG.

As shown in the lower line of the "Read" area in FIG. 2, a forward read is performed by interchanging the voltage Vd to be applied to the drain region MD and the Vs to be applied to the source region MS, that is, by applying a voltage of 0 V to the drain region and a voltage of 1.5 V to the source region.

The setting for the voltage Vmg to be applied to the memory gate MG for a read is between the memory transistor threshold voltage for a programming state and the memory transistor threshold voltage for an erase state. When the threshold voltages for the programming state and erase state are 5 V and −2 V, respectively, the voltage Vmg for a read is an intermediate value between the above two. If such an intermediate value is employed, the programming state and erase state can be differentiated from each other even when the threshold voltage for the programming state decreases by 2 to 3 V during data retention or when the threshold voltage for the erase state increases by 2 to 3 V during data retention. As a result, the data retention characteristic margin is increased. When the memory cell threshold voltage for the erase state is low enough, the voltage Vmg for a read may be set to 0V. When the voltage Vmg for a read is 0 V, it is possible to avoid a read disturb, that is, to prevent the threshold voltage from being varied by voltage application to the memory gate.

(2) The following description deals with a memory operation that is performed when an array is formed by a plurality of memory cells.

Figure 5:
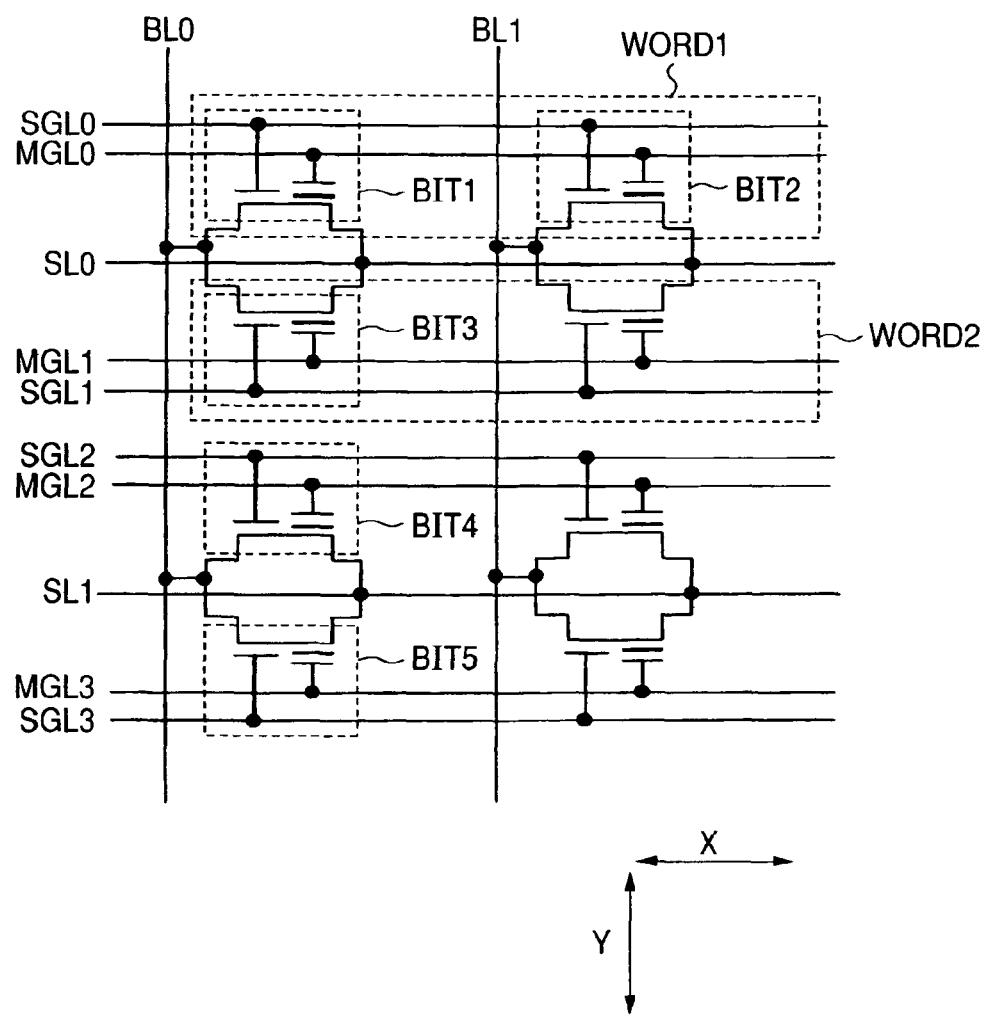
FIG. 5 is a circuit diagram illustrating a nonvolatile semiconductor memory array according to one embodiment of the present invention.

FIG. 5 is a circuit diagram illustrating a nonvolatile semiconductor memory array according to the present embodiment. For the sake of brevity, the figure shows 2×4 memory cells only.

As shown in the figure, there are select gate lines (word lines) SGL0-SGL3, memory gate lines MGL0-MGL3, and source lines SL0, SL1. These lines are parallel to each other and extended in the X direction. The select gate lines connect the select gates SG of the memory cells. The memory gate lines connect the memory gates MG. The source lines connect the source regions MS that are shared by two adjacent memory cells.

Also, there are bit lines BL0, BL1. These lines connect the drain regions MD of the memory cells and are extended in the Y direction, that is, in a direction perpendicular to those of the select gate lines SGL and the like.

Figure 9:
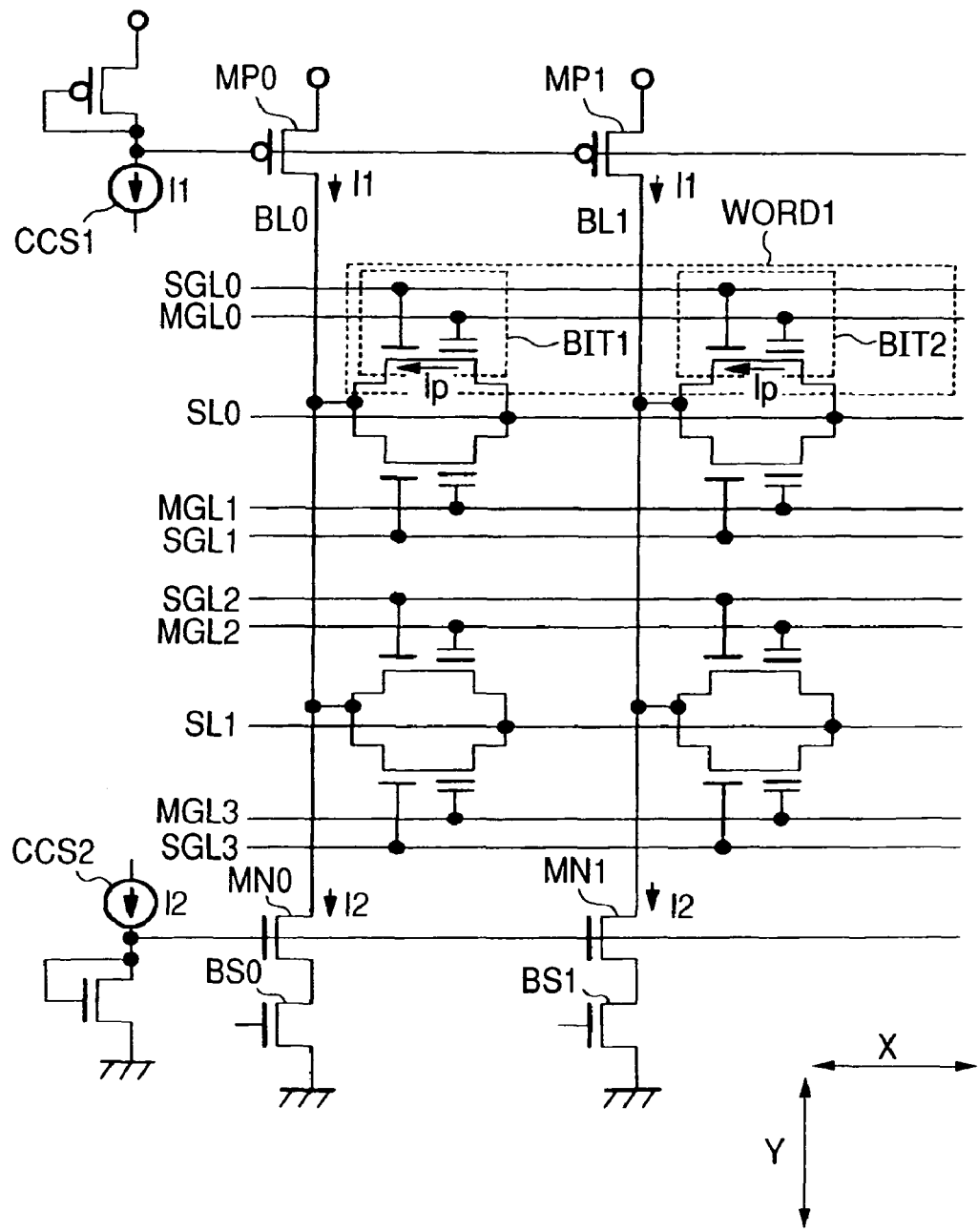
FIG. 9 is a circuit diagram illustrating a circuit for performing a programming/erase operation with a constant channel current in the memory array shown in FIG. 5.
Figure 10:
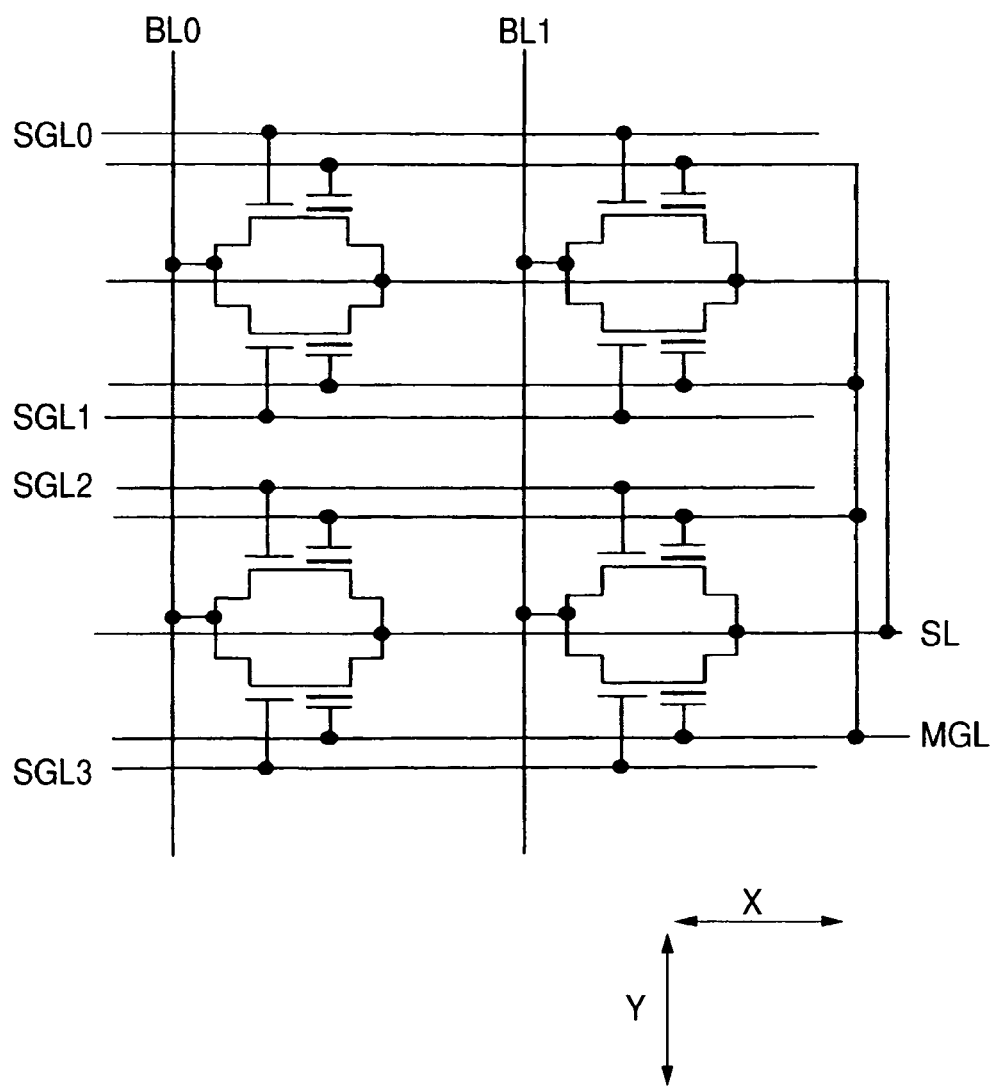
FIG. 10 is a circuit diagram illustrating another nonvolatile semiconductor memory array according to one embodiment of the present invention.
Figure 13:
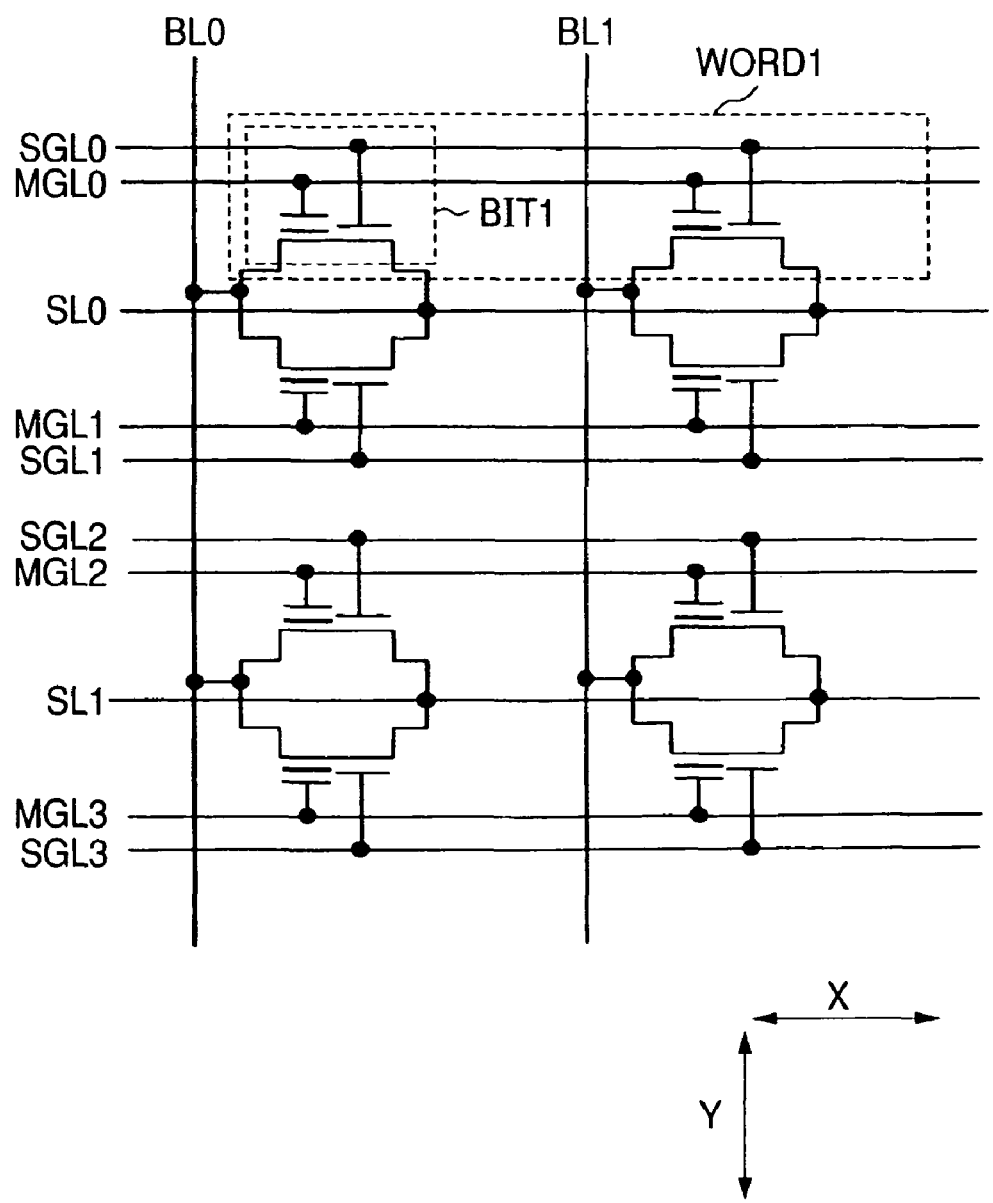
FIG. 13 is a circuit diagram illustrating another nonvolatile semiconductor memory array according to one embodiment of the present invention.

The above lines are extended in the above directions not only in the circuit diagram but also in the layouts of various elements and lines (this also holds true for FIGS. 9, 10, and 13). The select gate lines SGL and the like may alternatively comprise select gates SG or the lines connected to the select gates SG.

A boost driver (not shown in FIG. 5), which comprises a high-voltage MOS transistor for applying a high voltage for a programming/erasing operation, is connected to the source lines SL and memory gate lines MGL. A low-voltage, high-speed boost driver is connected to the select gate lines SGL in order to apply only a voltage as low as 1.5 V or so. Each local bit line is connected to 16, 32, or 64 memory cells. Each local bit line is connected to a global bit line via a MOS transistor, which selects a local bit line. The global bit line is connected to a sense amplifier.

FIGS. 6 and 7 show the conditions for applying a voltage to various lines when the memory array shown in FIG. 5 performs a programming, erasing, or reading operation. FIGS. 6 and 7 indicate the conditions for setting a programming/erasing channel current with the potential of a select gate line SGL and with the potential of a bit line BL, respectively. They respectively correspond to a case of setting a channel current, which is indicated in FIG. 2, with the voltage Vsg of the select SG (the first line in the "Erase" area of FIG. 2) and to a case of setting a channel current with the voltage Vd of the drain region MD (the second line in the "Erase" area of FIG. 2).

(2-1) First of all, the array operation performed for programming under the voltage conditions indicated in FIG. 6 will be described. To perform a programming operation, it is necessary that a current flow to a channel. In other words, the select transistor needs to be ON.

The programming conditions shown in FIG. 6 are the conditions that prevail when memory cell BIT1, which is shown in FIG. 5, is selected. As regards the select gate lines, the voltage for select gate line SGL0 is raised from 0 V to approximately 0.7 V. As for the bit lines, the voltage for bit line BL0 only is lowered from 1.5 V to 0 V. A voltage of 5 V is applied to source line SL0 to which the selected cell is connected. A voltage of 10 V is applied to memory data line MGL0. As a result, the potential of select gate line SGL is higher than those of the bit lines BL only at memory cell BIT1 shown in FIG. 5 so that the select transistor is ON. Consequently, the programming conditions shown in FIG. 2 are met so that a programming operation is performed.

In the above instance, a potential of 0.7 V is applied to the select gate SG of memory cell BIT2 or other memory cell that is connected to select gate line SGL0 to which selected cell BIT1 is connected. However, a potential (e.g., 1.5 V as shown in FIG. 6) higher than the potential (0.7 V) of select gate line SGL0 is applied to bit line BL1 or other bit line connected to the above-mentioned memory cell. In the above-mentioned memory cell, therefore, no programming operation is performed because the select transistor is OFF.

FIG. 6 shows the operating conditions for setting the channel current for programming in accordance with the potential of a select gate line SGL. However, when select gate line SGL0 and bit line BL0 of selected cell BIT1 are set to 1.5 V and 0.8 V, respectively, and select gate lines SGL1-SGL3 and bit line BL1, which are not connected to selected cell BIT1, are set to 0 V and 1.5 V, respectively, the potential of a select gate line SGL is higher than that of a bit line BL at selected cell BIT1 only so that the same programming operation can be performed even if setup is performed in accordance with the potential of a bit line BL shown in FIG. 7, that is, the drain region MD.

(2-2) Next, the erase operation performed under the voltage conditions shown in FIG. 6 will be described. FIG. 6 shows two different conditions. One set of conditions relates to a case where memory cell WORD1, which is connected to a single word line, is to be erased (the upper line in the "Erase" area of FIG. 6). The other set of conditions relates to a case where all cells shown in FIG. 5, which are connected to a plurality of word lines, are to be erased (the lower line in the "Erase" area of FIG. 6). In the former case, the time required for erasing all cells is long, but the power supply circuit area can be reduced. In the latter case, the required erase time can be reduced although the power supply circuit area increases.

When memory cell WORD1, which is connected to a single word line in the former case, is to be erased, the voltage for select gate line SGL0 is raised from 0 V to approximately 0.7 V while all the bit lines BL are set to 0 V. Further, a voltage of 7 V is applied to source line SL0 to which the selected cell is connected, and a voltage of −5 V is applied to memory gate line MGL0. As a result, in memory cell WORD1, which is shown in FIG. 5, the potential of a select gate line SGL is higher than that of a bit line BL so that the select transistor is ON. The erase conditions shown in FIG. 2 are then met so that an erase operation is performed. In this instance, a BTBT hot hole erase in which no current flows to a channel is performed in memory cell WORD2, which shares source line SL0 with memory cell WORD1. A BTBT hot hole erase in which a current flows to a channel is performed for memory cell WORD2 subsequently to memory cell WORD1.

When all the memory cells in FIG. 5, which are connected to the plurality of word lines in the latter case, are to be erased, it is necessary to raise the voltages for all the select gate lines SGL, to which the selected cells are connected, from 0 V to approximately 0.7 V while all the bit lines BL are at 0 V, and apply a voltage of 7 V to all the source lines SL to which the selected cells are connected, and a voltage of −5 V to the memory gate lines MGL.

The operating conditions described above apply to a case where the channel current for an erase is set in accordance with the potential of a select gate line SGL. However, when a select gate line SGL to which a selected cell is connected is set to 1.5 V while select gate lines SGL1-SGL3 to which no selected cell is connected are set to 0 V with all the bit lines BL set to 0.8 V, the potentials of the select gate lines SGL are higher than those of the bit lines BL at only selected cell BIT1 even if the channel current for an erase is to be set in accordance with the potential of a bit line BL shown in FIG. 7, that is, the drain region MD. As a result, an erase operation can be performed while a channel current flows.

(2-3) Next, the memory array read conditions will be described. For a read, it is necessary that the select transistor be ON as is the case with a programming or erase operation. The cell to be read is selected with a select gate line SGL and bit line BL.

Two read modes are used: reverse and forward. A reverse read is performed in a direction opposite that of source-drain voltage programming or erasing. A forward read is performed in the same direction as in source-drain voltage programming or erasing.

In the reverse mode, select gate line SGL0, which is connected to selected cell BIT1, and bit line BL0 are set to a potential of 1.5 V while select gate lines SGL1-SGL3, which are not connected to the selected cell, bit line BL1, and source lines SL0 and SL1 are set to a potential of 0 V.

In the forward mode, the potentials of select gate line SGL0, which is connected to selected cell BIT1, and bit line BL0 are set to 1.5 V and 0 V, respectively. Further, the potentials of select gate lines SGL1-SGL3 and bit line BL1 are set to 0 V and 1.5 V, respectively. Furthermore, the potentials of source lines SL0 and SL1 are set to 1.5 V.

As regards the potentials for the memory gate lines MGL, a potential of 1.5 V should be applied only to memory gate line MGL0, to which the selected cell is connected, for the purpose of acquiring a larger read current. Under the read voltage conditions indicated in FIGS. 6 and 7, memory cell BIT1, which is shown in FIG. 5, is read in both the reverse mode and forward mode.

(2-4) The aforementioned tunnel-electron-injection-based hole neutralization procedure to be performed for the memory array will now be described. The tunnel-electron-injection-based hole neutralization procedure can be performed during a programming operation or erasing operation.

Figure 8:
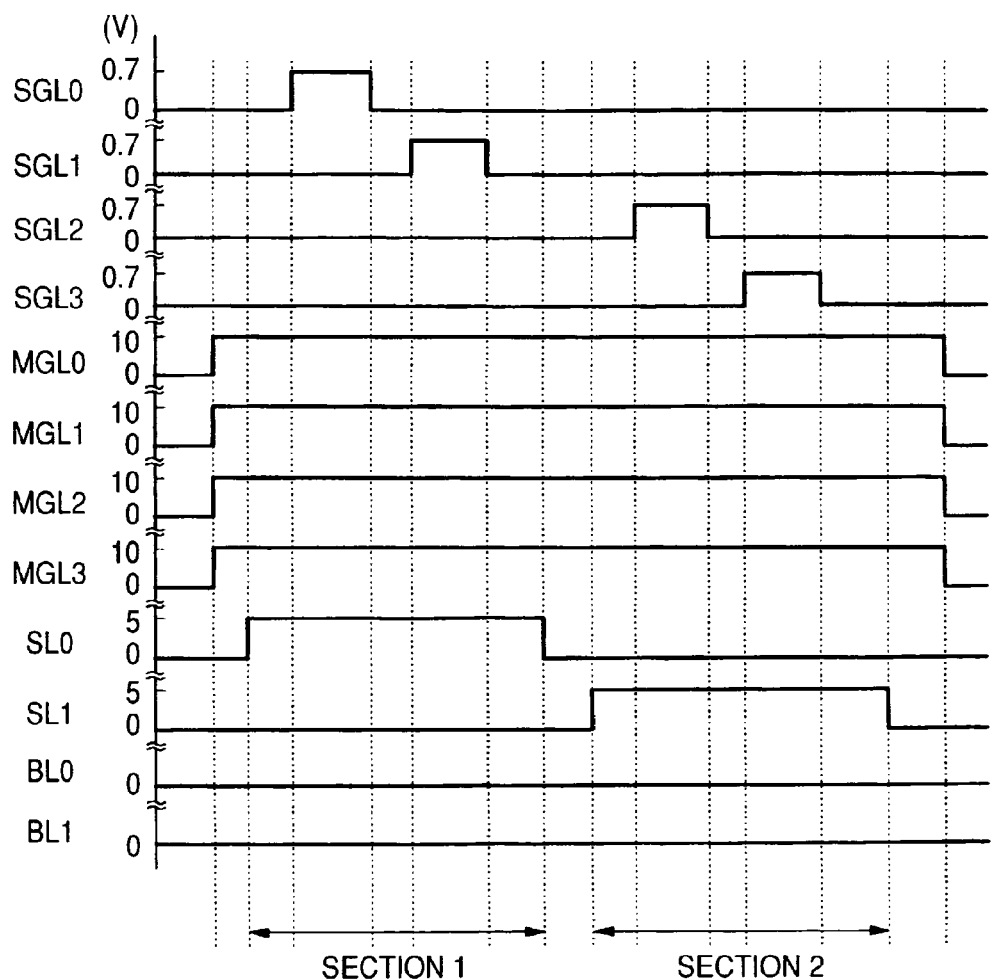
FIG. 8 is a timing diagram illustrating voltages that are applied to various lines when the memory array shown in FIG. 5 performs a programming operation.

FIG. 8 is a voltage application timing diagram illustrating a tunnel-electron-injection-based hole neutralization procedure that is performed during programming. In section 1, memory cells BIT1 and BIT3 meet the programming voltage conditions indicated in FIG. 6 and become programmed (source side electron injection into silicon nitride film SIN). Meanwhile, in memory cells BIT4 and BIT5, which is not being programmed, the source potential is lowered to 0 V to apply a high electric field between the memory gate and source so as to perform the tunnel-electron-injection-based hole neutralization procedure. In section 1, the potential of source line SL0 is higher than that of source line SL1 for memory cells BIT4 and BIT5. Therefore, the electric field between the memory gate and source lowers accordingly so that tunnel injection is not performed for memory cells BIT1 and BIT3 unlike memory cells BIT4 and BIT5 (only source side injection takes place). Similarly, in section 2, memory cells BIT4 and BIT5 meet the programming voltage conditions indicated in FIG. 6 and are programmed (source side injection). Meanwhile, in memory cells BIT1 and BIT3 in which no programming is being performed, the source potential is lowered to 0V so as to apply a high electric field between the memory gate and source, thereby performing the tunnel-electron-injection-based hole neutralization procedure. In section 2, the potential of source line SL1 is higher than that of source line SL0 of memory cells BIT1 and BIT3. Therefore, the electric field between the memory gate and source decreases accordingly so that tunnel injection is not performed for memory cells BIT4 and BIT 5 unlike memory cells BIT1 and BIT3 (only source side injection takes place for memory cells BIT4 and BIT 5). When the tunnel-electron-injection-based hole neutralization procedure described above is performed, the charge retention characteristic can be improved as shown in FIG. 4. In other words, an excellent charge retention characteristic can be obtained when a programming operation is performed in two steps. In the first step, electron injection is achieved by means of source side injection (when programming is selected). In the second step, the hole neutralization procedure is performed by means of tunnel injection (when programming is not selected).

The voltage application conditions for the hole neutralization procedure are such that a positive potential should be applied to a memory gate line (memory gate MG) while a potential of 0 V or a potential lower than that of the memory gate line (memory gate MG) should be applied to a source line (source region MS). Further, a potential equal to or lower than that of a bit line (drain region MD) should be applied to a select gate line (select gate SG). The example shown in FIG. 8 applies a potential of 10 V to the memory gate MG, a potential of 0 V to the source region MS, a potential of 0 V to the select gate SG, and a potential of 0 V to the drain region MD.

The tunnel-electron-injection-based hole neutralization procedure that is performed during programming has been described above. However, this hole neutralization procedure may also be performed during an erase operation. As is the case with a programming operation, hole neutralization during an erase operation is achieved in an unselected memory cell for an erase by applying a positive potential to the memory gate line (memory gate MG) and applying a potential of 0 V or a potential lower than that of the memory gate line (memory gate MG) to the source line (source region MS). Further, a potential equal to or lower than that of a bit line (drain region MD) should be applied to a select gate line (select gate MG).

(2-5) The programming and erasing operations in which constant voltages are applied have been described in Sections (2-1) and (2-2). Section (2-5) describes the programming and erasing procedures that are performed by controlling the circuitry so as to provide a constant channel current for a programming/erasing operation. FIG. 9 shows a typical circuit configuration that performs a programming or erasing operation to provide a constant channel current. The end of bit line BL0 (or bit line BL1) is provided with a mirror circuit that comprises a PMOS transistor, whereas the end of bit line BL1 (or bit line BL0) is provided with a mirror circuit that comprises an NMOS transistor.

The erasing operation to be performed with a constant channel current flowing to memory cell WORD1 will now be described.

First of all, the voltages indicated in FIG. 7 are applied to those other than bit lines BL0 and BL1. Current I1 flows to constant current supply CCS1. Current I2, which is larger than current I1, flows to constant current supply CCS2. When bit-line select transistors BS0 and BS1 for bit lines BL0 and BL1, which are connected to selected cell WORD1, are turned ON, current I2 flows to NMOS transistors MN0 and MN1 from a bit line in the ground direction and current I1 flows to PMOS transistors MP0 and MP1 in a bit-line-entering direction in accordance with mirror circuit principles. The current difference between I2 and I1 is supplied to a bit line only via bit-line-connected memory cell WORD1 for which the select transistor is ON. In other words, current Ip (=I2−I1) flows to the channel of selected cell BIT1. As described above, an erase operation can be performed with a current flowing to a channel by inverting the bit-line select transistor while the difference between I2 and I1 is set as the channel current value for an erase.

In a programming operation, too, an erase can be performed with a current flowing to a channel as is the case with an erase operation. As regards a programming operation, a programming cell selection can be made depending on whether a channel current flows. Therefore, only the bit-line select transistor for a bit line to which the memory cell to be programmed is connected should be turned ON. The potentials of bit lines to which the selected cell is not connected are raised via a PMOS transistor to 1.5 V, which is higher than that of the select transistor (SG0: 1.5 V; SG1-SG3: 0 V). The select transistors for all the memory cells connected to bit line BL1 turn OFF, thereby inhibiting unselected cells from being programmed. If the potential of bit line BL1 decreases from 1.5 V due, for instance, to bit line junction leakage, the select transistor for a BIT2-designated memory cell turns ON. This causes a current flow to a channel so that a weak programming operation is performed. Such a weak programming operation can be avoided by operating the mirror circuit to supply a current via PMOS transistor MP1.

When memory cells (e.g., n×m memory cells) connected to a plurality of word lines are to be simultaneously erased, the bit-line select transistors for all the bit lines connected to selected cells are turned ON, and the difference between current I2 of constant current supply CCS2 and current I1 of constant current supply CCS1 is rendered equal to the product of the channel current Ip for an erase and the number of memory cells (m) connected to bit lines, that is, I2−I1=Ip×m. In this manner, channel current Ip flows for each cell to be erased.

(3) Another memory array configuration will now be described. FIG. 10 is a circuit diagram illustrating another nonvolatile semiconductor memory array according to the present embodiment.

Unlike the memory array configuration shown in FIG. 5, a plurality of source lines are connected so as to provide a common source line SL. Further, a plurality of memory gate lines are connected to provide a common memory gate line MGL.

Since the common source line SL and common memory gate line MGL are provided, the number of high-voltage drivers for driving the lines is decreased to reduce the required chip area. The wiring for memory array configuration may alternatively be commonalized only for either the source lines SL or memory gate lines MGL.

FIGS. 11 and 12 illustrate the conditions for applying a voltage to various lines when the memory array shown in FIG. 10 performs a programming, erasing, or reading operation. The conditions indicated in FIG. 11 apply when the channel current for a programming or erasing operation is set in accordance with the potential of a select gate line SGL. The conditions indicated in FIG. 12 apply when the channel current for a programming or erasing operation is set in accordance with the potential of a bit line BL.

The voltages to be applied to the bit line BL and select gate line SGL are exactly the same as for the memory array shown in FIG. 5. The voltage to be applied to the common source line SL and common memory gate line MGL are the same as those applied to selected cell BIT1 of the memory array shown in FIG. 5.

More specifically, voltages of 5 V and 10 V are applied to the source line SL and memory date line MGL, respectively, for a programming operation. For an erase operation, voltages of 7 V and −5 V are applied to the source line SL and memory date line MGL, respectively. For a reverse read operation, voltages of 0 V and 1.5 V are applied to the source line SL and memory date line MGL, respectively. For a forward read operation, a voltage of 1.5 V is applied to both the source line SL and memory date line MGL.

(4) Next, another memory array configuration will now be described. FIG. 13 is a circuit diagram illustrating another nonvolatile semiconductor memory array according to the present embodiment.

The memory array configuration shown in FIG. 13 differs from the one shown in FIG. 5 in that the positions of the memory transistor and select transistor are interchanged. The bit lines BL are connected to the diffusion layer (drain region) on the memory transistor side, whereas the source lines SL are connected to the diffusion layer (source region) on the select transistor side.

FIGS. 14 and 15 illustrate the conditions for applying a voltage to various lines when the memory array shown in FIG. 13 performs a programming, erasing, or reading operation. The conditions indicated in FIG. 14 apply when the channel current for a programming or erasing operation is set in accordance with the potential of a select gate line SGL. The conditions indicated in FIG. 15 apply when the channel current for a programming or erasing operation is set in accordance with the potential of a bit line BL.

If the voltage applied to the source lines SL in the memory array shown in FIG. 5 is applied to the bit lines BL and the voltage applied to the bit lines BL is applied to the source lines SL, the same programming, erasing, and reading operations are performed as in the memory array shown in FIG. 5.

The programming conditions shown in FIG. 14 state that, as regards the select gate lines, only the voltage of select gate line SGL0 is raised from 0 V to approximately 0.7 V. As regards the source lines, only the voltage of source line SL0 is lowered from 1.5 V to 0 V. A voltage of 5 V is applied to bit line BL0 to which a selected cell is connected. A voltage of 10 V is applied to memory gate line MGL0 at the time of programming. As a result, a programming operation is performed in memory cell BIT1, which is shown in FIG. 13.

When memory cell WORD1, which is connected to a single word line, is to be erased under the erase conditions shown in FIG. 14, the voltage of select gate line SGL0 is raised from 0 V to approximately 0.7 V while all the bit lines BL and source lines SL are set to 0 V. Further, a voltage of 7 V is applied to bit line BL0 to which the selected cell is connected, and a voltage of −5 V is applied to memory gate line MGL0. As a result, in memory cell WORD1, which is shown in FIG. 13, the potential of a select gate line SGL is higher than that of a source line SL so that the select transistor turns ON. The erase conditions shown in FIG. 2 are then met so that an erase operation is performed. When all the cells that are shown in FIG. 13 and connected to a plurality of word lines are to be erased, the voltage for all the select gate lines SGL to which the selected cells are connected should be raised from 0 V to approximately 0.7 V while all the source lines SL are at 0 V. Further, voltages of 7 V and −5 V should be applied respectively to all the bit lines BL and memory gate lines MGL to which the selected cells are connected.

As regards the read conditions shown in FIGS. 14 and 15, this memory array differs from the memory array shown in FIG. 5 in that the positions of the memory transistor and select transistor are interchanged. Therefore, the voltage application conditions indicated in FIG. 5 for the reverse read and forward read modes are interchanged.

FIGS. 2, 6, 7, 11, 12, 14, and 15 show voltage conditions for memory operations. The conditions shown in these figures are merely presented as examples. The present invention is not limited to the numerical values indicated in these figures. In the memory array shown in FIG. 10 or 13, a constant channel current programming or erasing operation may also be performed according to a circuit method shown in FIG. 9.

Figure 16:
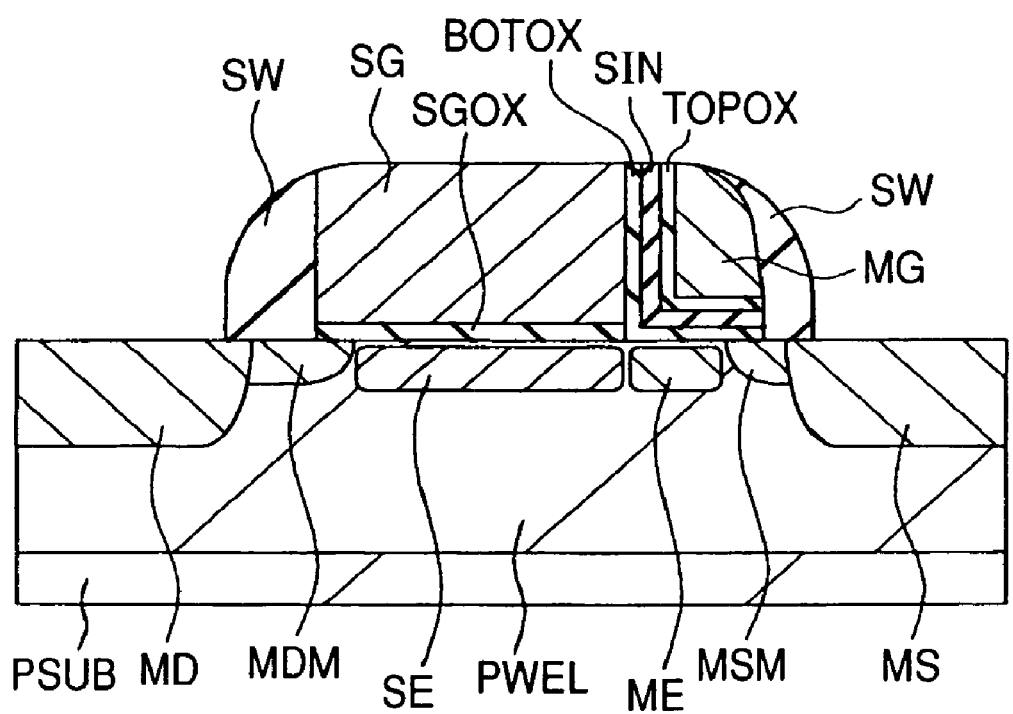
FIG. 16 is a cross-sectional view illustrating an essential part of a nonvolatile semiconductor memory device (flash memory) according to one embodiment of the present invention.

(5) The concrete configuration of a memory cell capable of performing an erase according to the above method, increasing the erase/read speed, and enhancing the high-temperature data retention reliability will now be described with reference to FIG. 16.

When a negative voltage is applied to the memory gate MG for performing the above erase operation, it is necessary that a current flow between the source and drain.

To achieve the above purpose, it is necessary to increase the memory transistor channel length or use an n-type channel region (ME) for the memory transistor.

Both of the above two contribute to an increase in the read current. Therefore, the memory cell that uses an erase method according to the present invention is suitable for a high-speed read operation.

In addition, the erase method according to the present invention uses a hole injection technique. Therefore, a large read current can be obtained while the threshold voltage prevailing after an erase operation is lower than a neutral threshold voltage. Also in this sense, the memory cell that uses an erase method according to the present invention is suitable for a high-speed read operation.

The erase speed is higher than the tunneling erase speed because a hot carrier injection technique is used. Further, if the memory transistor channel length is increased or if the concentration of an n-type dopant of the memory transistor channel region (ME) is increased, the read current increases to provide an increased speed.

For the channel region SE for one select transistor, the impurity concentration is set so that the select transistor threshold voltage is higher than the neutral threshold voltage for the memory transistor. The neutral threshold voltage for the memory transistor is a threshold value for a state where no charge is stored in the charge storage region.

If the select transistor threshold voltage is too high, a large read current cannot be obtained. If the select transistor threshold voltage is too low, the select transistor does not turn OFF completely even when its gate voltage is 0 V. As a result, a leak current obstructs a normal read operation. It is therefore preferred that the select transistor threshold voltage be positive and low.

The impurity profile of the drain region MD and source region MS will now be described.

While the memory operates, the maximum voltage applied to the drain region MD is approximately 1.8 V. Therefore, the employed source/drain structure of the MOS transistor should assume that a drive voltage of 1.8 V is used. For example, the drain region MD should comprise a doped region with a high concentration of n-type dopant, which is equivalent to a MOS transistor operating on a voltage of 1.8 V. Further, an LDD structure may be used by providing the gate end of the drain region MD with a doped region with a low concentration of n-type dopant MDM.

The source region MS is also a doped region with a high concentration of n-type dopant. Further, the gate end of the source region (the doped region with a high concentration of n-type dopant) may be provided with an n-type doped region (a doped region with a low concentration of n-type dopant) MSM. The impurity concentration of this n-type doped region MSM needs to be appropriate for invoking BTBT. For example, it is more preferable that the impurity concentration of the n-type doped region MSM be approximately between $10^{18}/cm^3$ and $10^{20}/cm^3$. It is even more preferable that the impurity concentration of the n-type doped region MSM be approximately between $10^{18}/cm^3$ and $10^{19}/cm^3$. It is also preferred that the impurity concentration of the n-type doped region MSM be lower than that of the doped region with a high concentration of n-type dopant MS.

The film thicknesses of the silicon nitride film SIN below the memory gate MG and the oxides TOPOX, BOTOX above and below the silicon nitride film SIN are important factors that determine the memory characteristics.

The memory cell that employs an erase method according to the present invention uses a hot carrier injection technique for both programming and erasing purposes. Therefore, the film thicknesses of the oxides above and below the silicon nitride film can be increased. The film thicknesses are 3 to 15 nm for the silicon nitride film SIN and 3 to 10 nm for the oxides TOPOX, BOTOX above and below the silicon nitride film. When the film thicknesses of the oxides TOPOX, BOTOX are not less than 3 nm, it is possible to inhibit the stored charge from being changed by a tunneling phenomenon.

When the film thicknesses of the oxides above and below the silicon nitride film are increased as described above, the high-temperature retention characteristic becomes improved. In addition, the retention characteristic prevailing after programming/erasing is inhibited from deteriorating.

(6) A typical method for manufacturing the nonvolatile semiconductor memory device (memory cell) shown in FIG. 16 will now be described with reference to FIGS. 17 through 24. FIGS. 17 through 24 are cross-sectional views of an essential part of a substrate, which illustrate how to manufacture a nonvolatile semiconductor memory device according to the present embodiment. Each of these figures shows the cross sections of two memory cell regions that share a source region.

Figure 17:
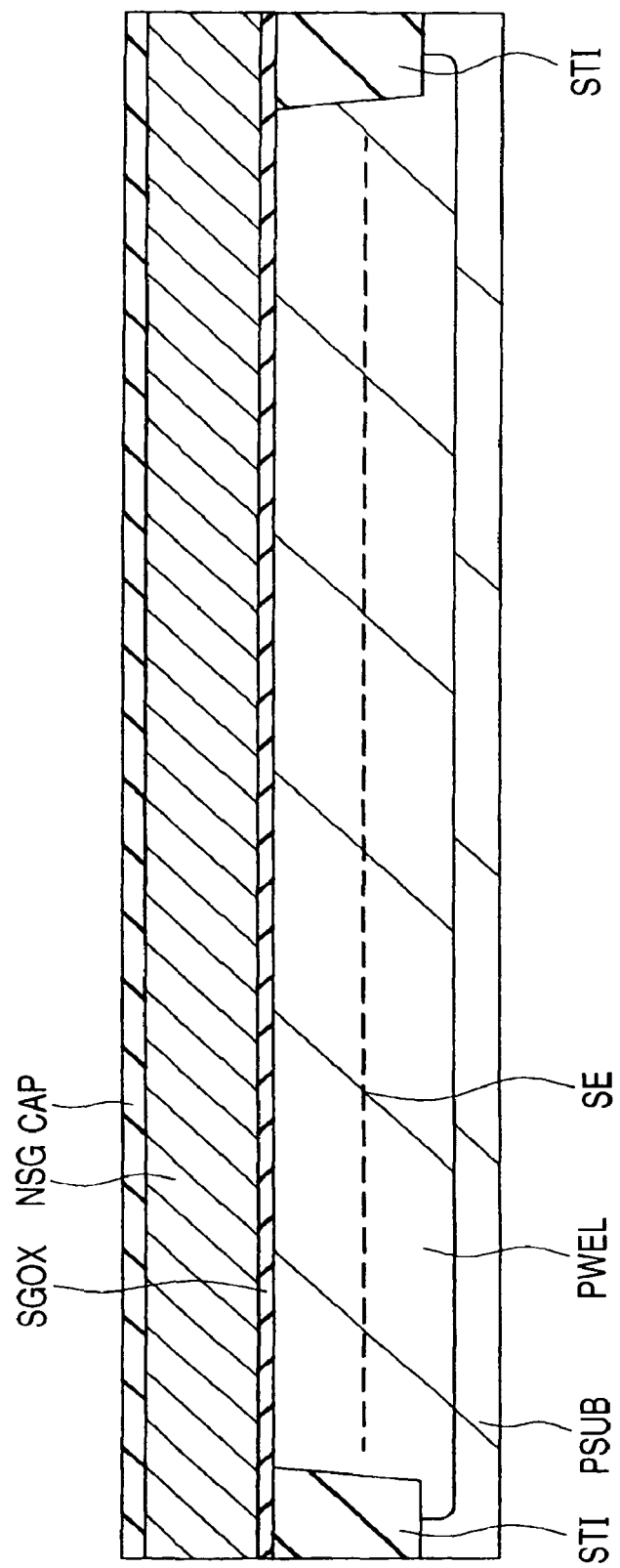
FIG. 17 is a cross-sectional view illustrating how to manufacture an essential part of a substrate of a nonvolatile semiconductor memory device according to one embodiment of the present invention.

First of all, FIG. 17 will be used for description. An isolation oxide region STI is formed on a p-type silicon substrate PSUB to form a p-type well region PWEL, which serves as a memory cell region.

A p-type doped region (channel region) SE for adjusting the select transistor threshold value is formed on the surface of the p-type well region PWEL. After the silicon substrate surface is cleaned up, a gate insulator SGOX for the select transistor is formed by thermal oxidation. An n-type polysilicon layer NSG (100 nm or so), which serves as a select gate, and a silicon oxide film CAP for select gate protection are then sequentially piled on the gate insulator SGOX.

Figure 18:
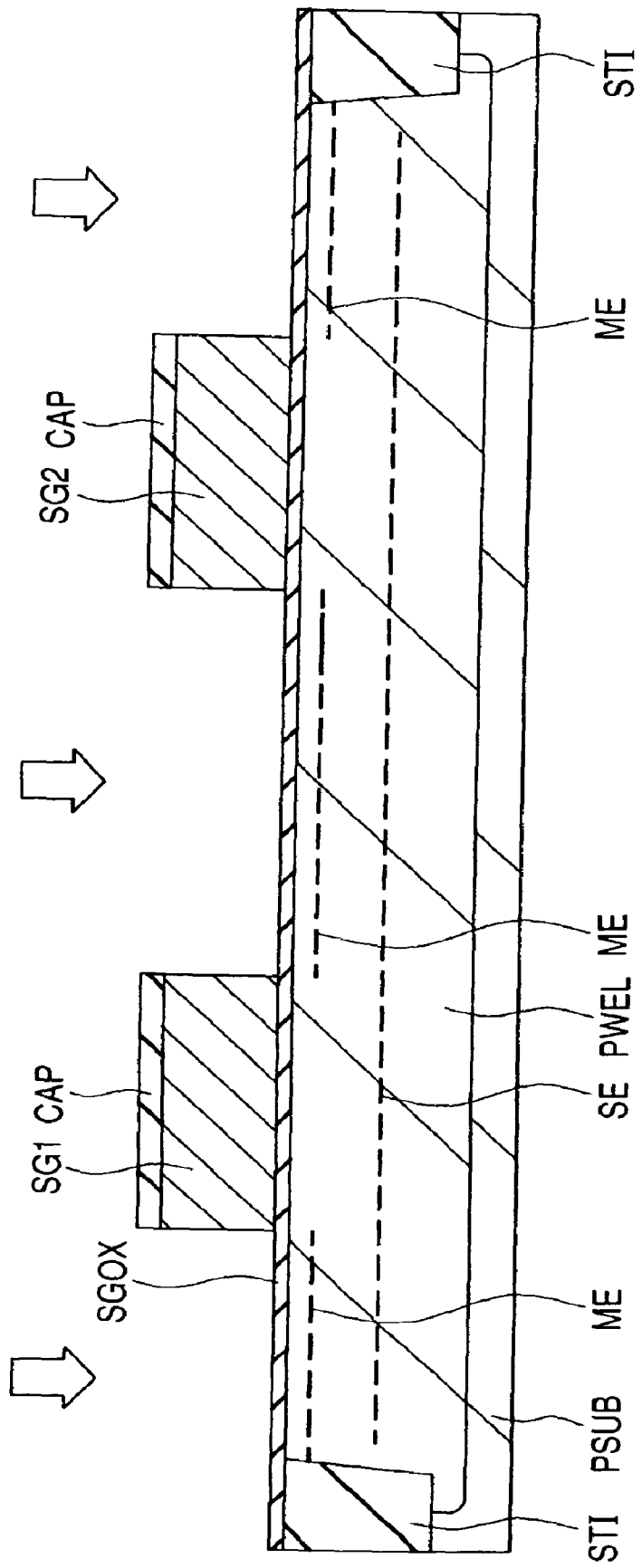
FIG. 18 is a cross-sectional view illustrating how to manufacture an essential part of a substrate of a nonvolatile semiconductor memory device according to one embodiment of the present invention.

Next, FIG. 18 will be used for description. The photolithography and dry etching techniques are used to process the n-type polysilicon layer NSG, which is formed on the silicon substrate as indicated in FIG. 17, for the purpose of forming select gates SG1 and SG2 for the select transistor. These select gates extend in the direction of the depth of the drawing and comprise a linear pattern. This pattern corresponds to the memory array's select gate lines GL (see FIG. 5). When the pattern is to be formed, the dry etching process is stopped to avoid unnecessary damage to the silicon substrate surface when the surface of the thermal oxide film (SGOX) is exposed. An n-type doped region ME for threshold value adjustment is then formed in the memory transistor channel region on the silicon substrate surface. For example, the impurity concentration of the n-type doped region ME is approximately $1 \times 10^{12}/cm^2$.

Figure 19:
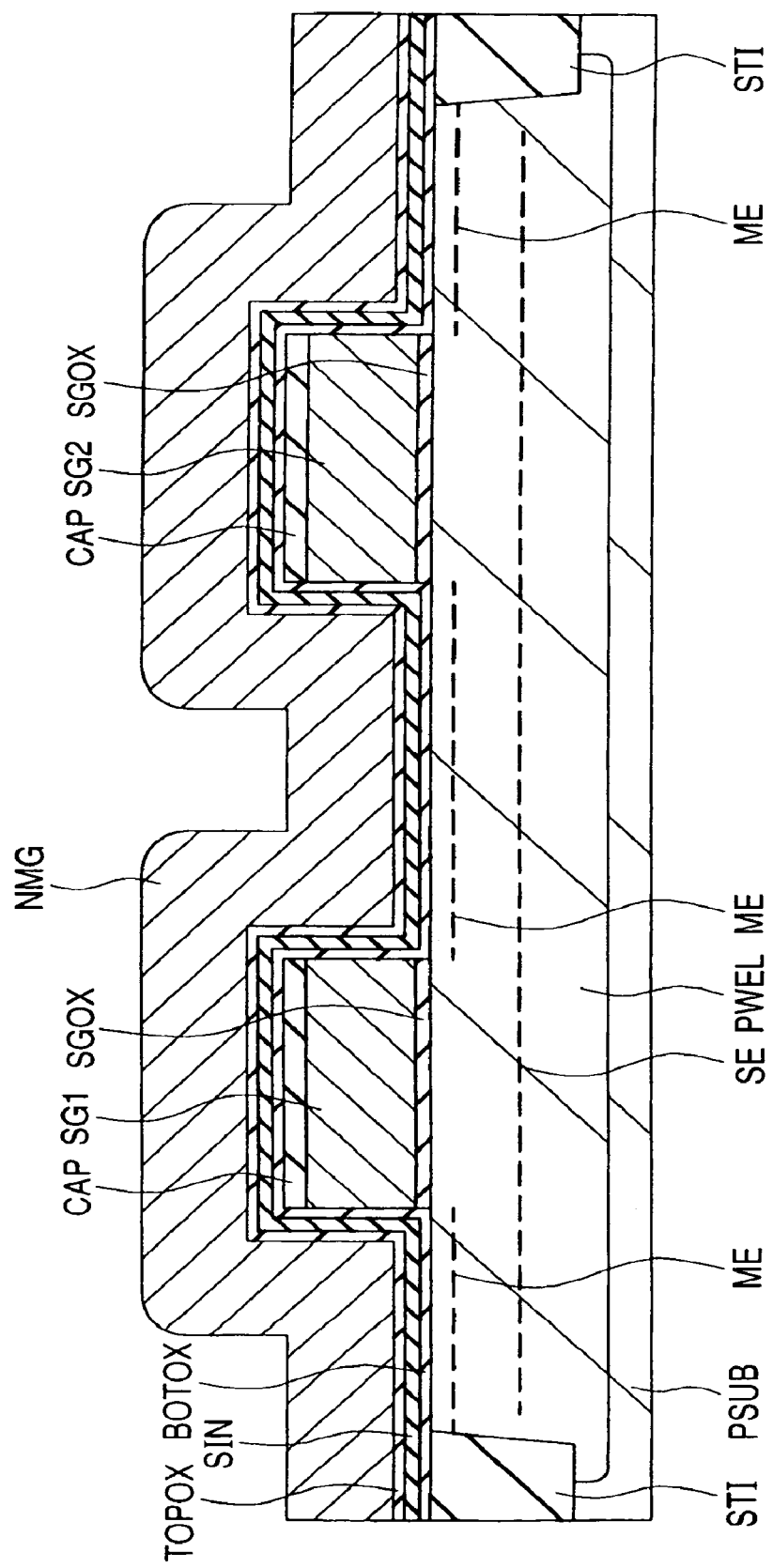
FIG. 19 is a cross-sectional view illustrating how to manufacture an essential part of a substrate of a nonvolatile semiconductor memory device according to one embodiment of the present invention.

Next, FIG. 19 will be used for description. The thermal oxide film (SGOX), which is left for silicon substrate surface protection as indicated in FIG. 18, is removed with hydrofluoric acid to form an ONO (Oxide-Nitride-Oxide) film, which serves as a memory transistor gate insulator. The silicon oxide film CAP may also be removed from the select gate SG at the time when the thermal oxide film (SGOX) is removed.

The ONO film is formed, for instance, by forming the bottom oxide BOTOX (approximately 3 to 10 nm) by thermal oxidation, placing the silicon nitride film SIN over the bottom oxide BOTOX, and forming the top oxide TOPOX by vapor phase growth and thermal oxidation. It is preferred that the film thicknesses of the bottom oxide BOTOX and top oxide TOPOX be at least 3 nm to minimize the occurrence of a tunneling phenomenon.

Next, an n-type polysilicon layer NMG (100 nm or so), which serves as a memory gate MG, is formed over the ONO film.

Figure 20:
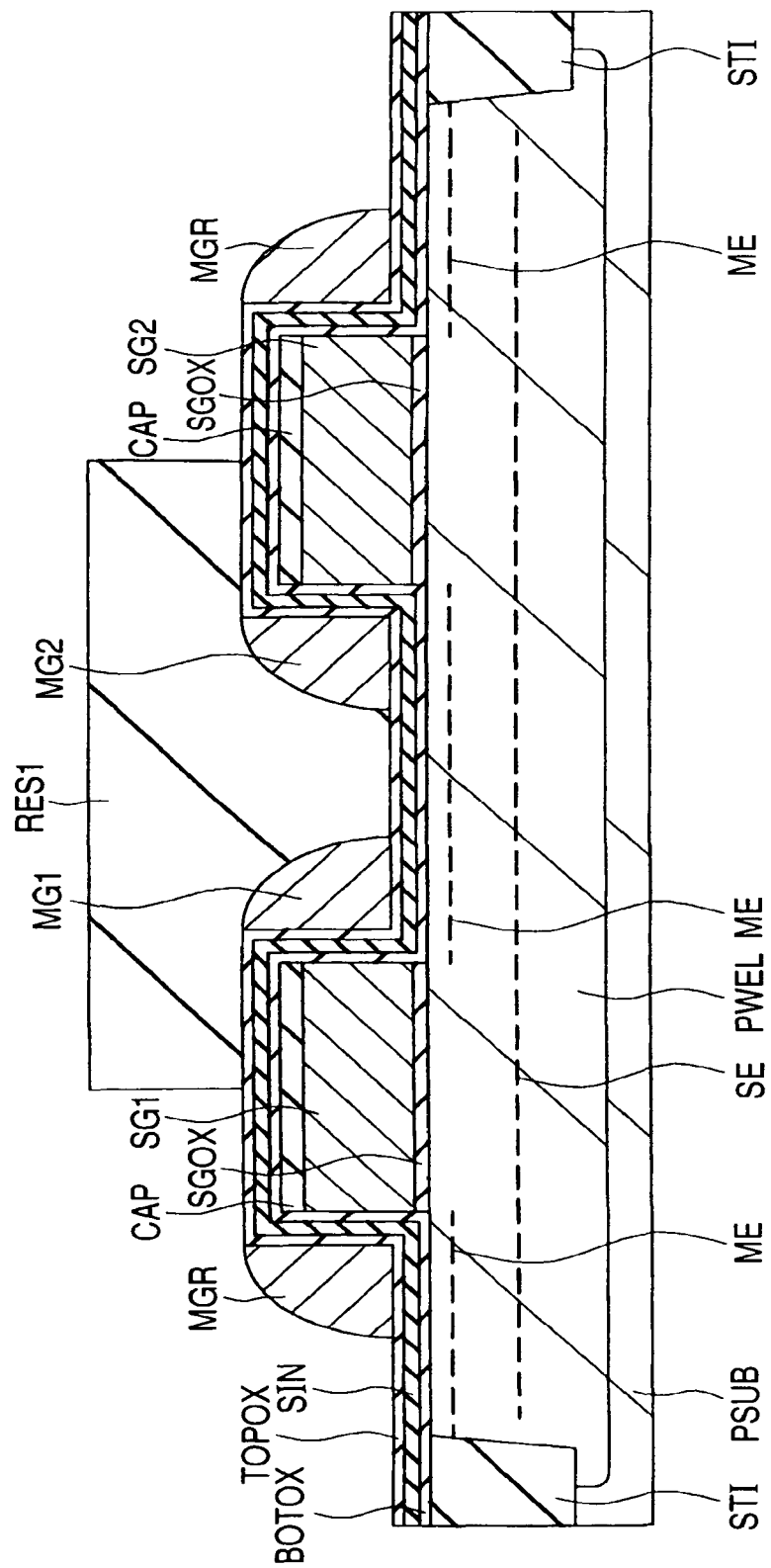
FIG. 20 is a cross-sectional view illustrating how to manufacture an essential part of a substrate of a nonvolatile semiconductor memory device according to one embodiment of the present invention.

Next, FIG. 20 will be used for description. The anisotropic etching technique is used to etch the n-type polysilicon layer NMG, which is formed as indicated in FIG. 19, until the top oxide TOPOX is exposed. Memory gates MG1 and MG2 are then formed on the sidewalls of select gates SG1 and SG2 via the ONO film. The spacer width should be 40 to 90 nm for memory gates MG1 and MG2. In this instance, a polysilicon sidewall spacer MGR is created on the sidewalls of select gates SG1 and SG2, which are on the side opposite that of memory gates MG1 and MG2.

For removing the sidewall spacer MGR, the photolithography technique is then used to cover memory gates MG1 and MG2 with a photoresist film RES1. In this instance, the photoresist film RES1 is formed so that its end is positioned above select gates SG1 and SG2.

Figure 21:
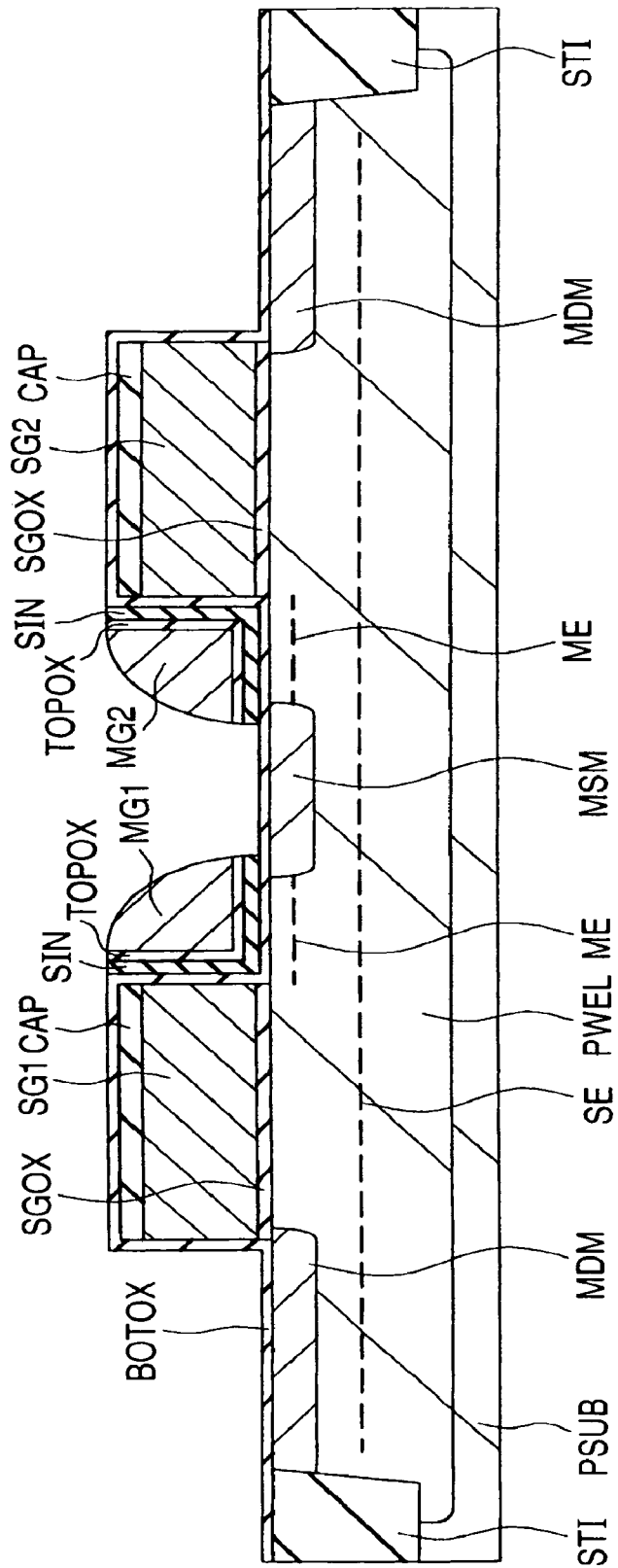
FIG. 21 is a cross-sectional view illustrating how to manufacture an essential part of a substrate of a nonvolatile semiconductor memory device according to one embodiment of the present invention.

Next, FIG. 21 will be used for description. The polysilicon sidewall spacer MGR created as indicated in FIG. 20 is removed by the use of the dry etching technique. Further, the photoresist film RES1 is removed. The exposed top oxide TOPOX and silicon nitride film SIN are then removed with hydrofluoric acid and hot phosphoric acid. Subsequently, ion implantation is performed for a low concentration n-type impurity to form a doped region with a low concentration of n-type dopant MDM in the drain section. When ion implantation is conducted, a doped region with a low concentration of n-type dopant MSM is also formed in the source section. The doped regions with a low concentration of n-type dopant MDM, MSM may be separately formed in the drain and source sections with the photolithography technique and resist film.

It should be noted that the polysilicon sidewall spacer MGR is removed as illustrated in FIG. 21 for the purpose of forming a doped region with a low concentration of n-type dopant MDM in the drain section. If, for instance, the photolithography technique is used to cover the top of the source section with a photoresist and form the doped region with a low concentration of n-type dopant MDM in the drain section after an n-type doped region ME is formed as indicated in FIG. 18, there is no need to remove the polysilicon sidewall spacer MGR.

Figure 22:
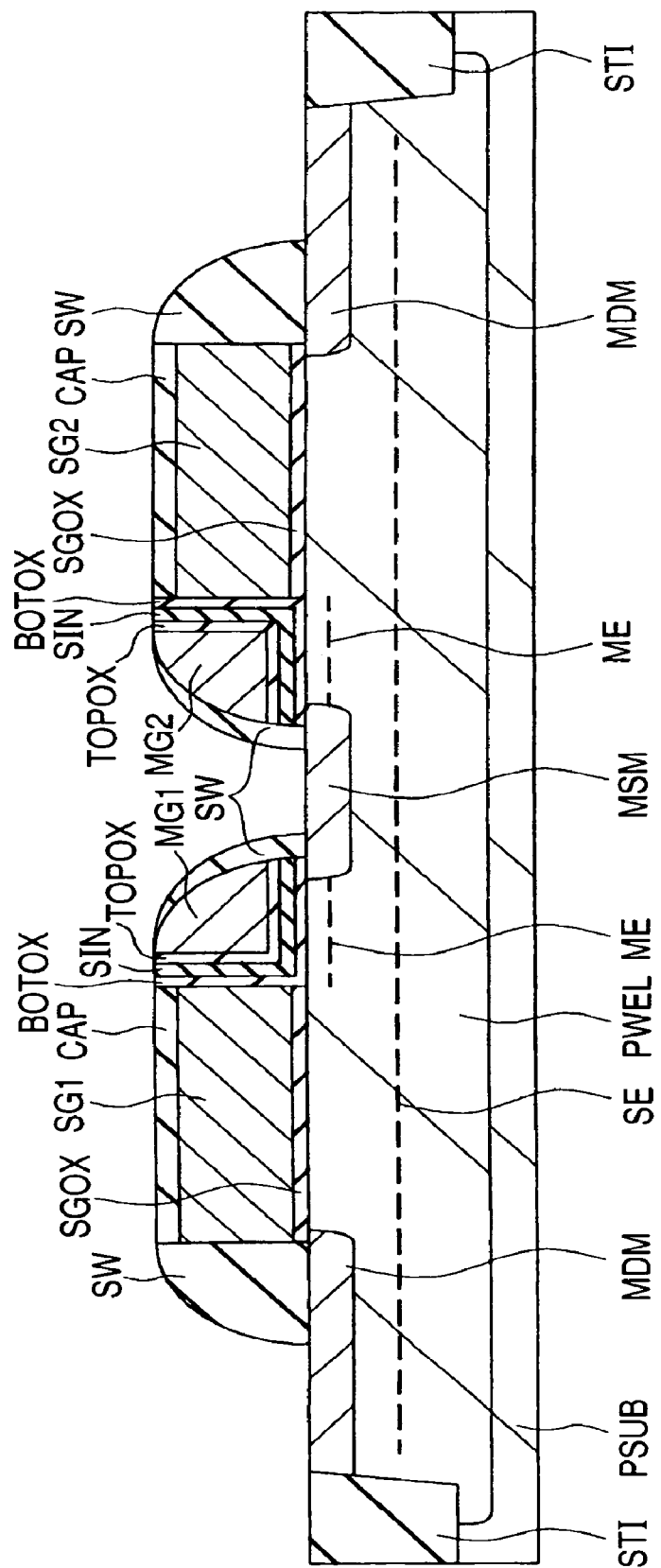
FIG. 22 is a cross-sectional view illustrating how to manufacture an essential part of a substrate of a nonvolatile semiconductor memory device according to one embodiment of the present invention.

Next, FIG. 22 will be used for description. After the exposed portion of the bottom oxide BOTOX of the ONO film is removed with hydrofluoric acid, an oxide is accumulated. The anisotropic etching technique is then used to conduct etching for the purpose of forming a sidewall spacer SW on the sidewalls of select gates SG1 and SG2 and memory gates MG1 and MG2.

Figure 23:
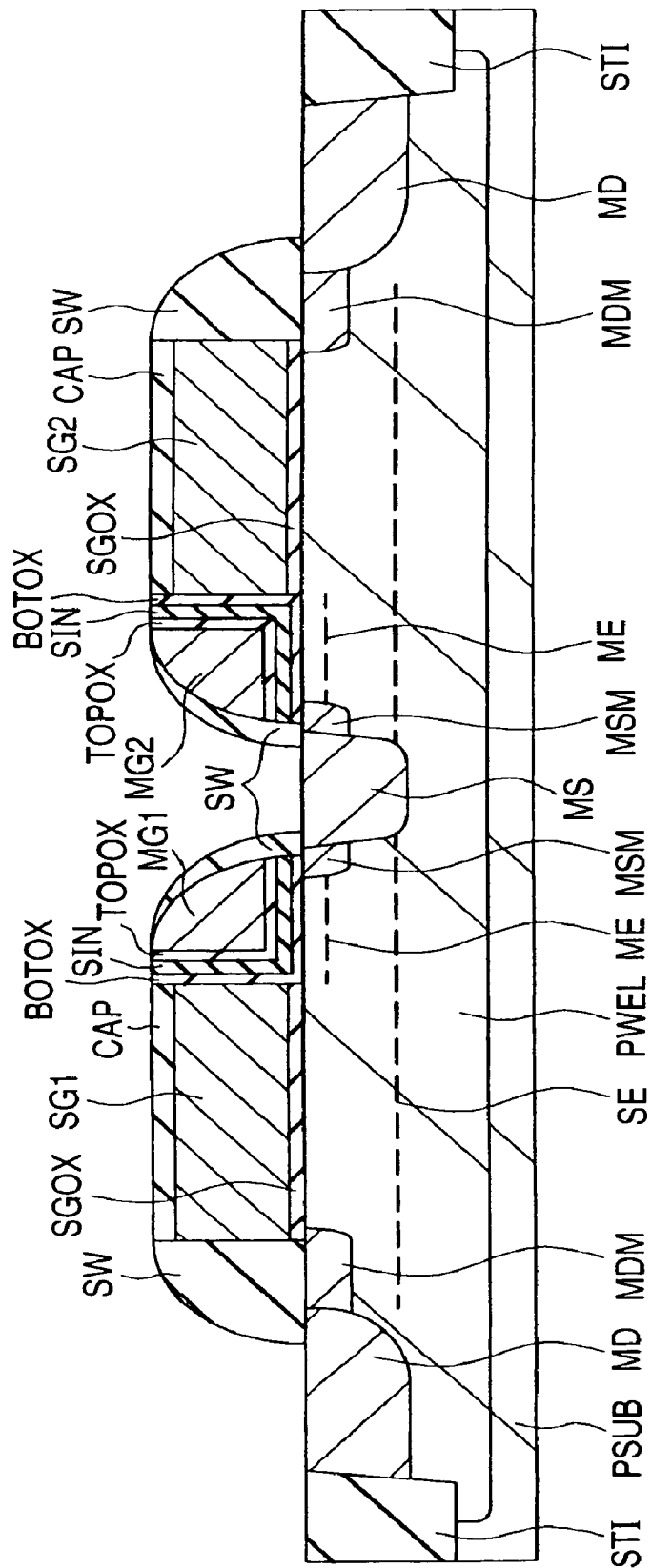
FIG. 23 is a cross-sectional view illustrating how to manufacture an essential part of a substrate of a nonvolatile semiconductor memory device according to one embodiment of the present invention.

Next, FIG. 23 will be used for description. Ion implantation is performed for an n-type impurity to form a select transistor drain region MD and memory transistor source region MS.

Figure 24:
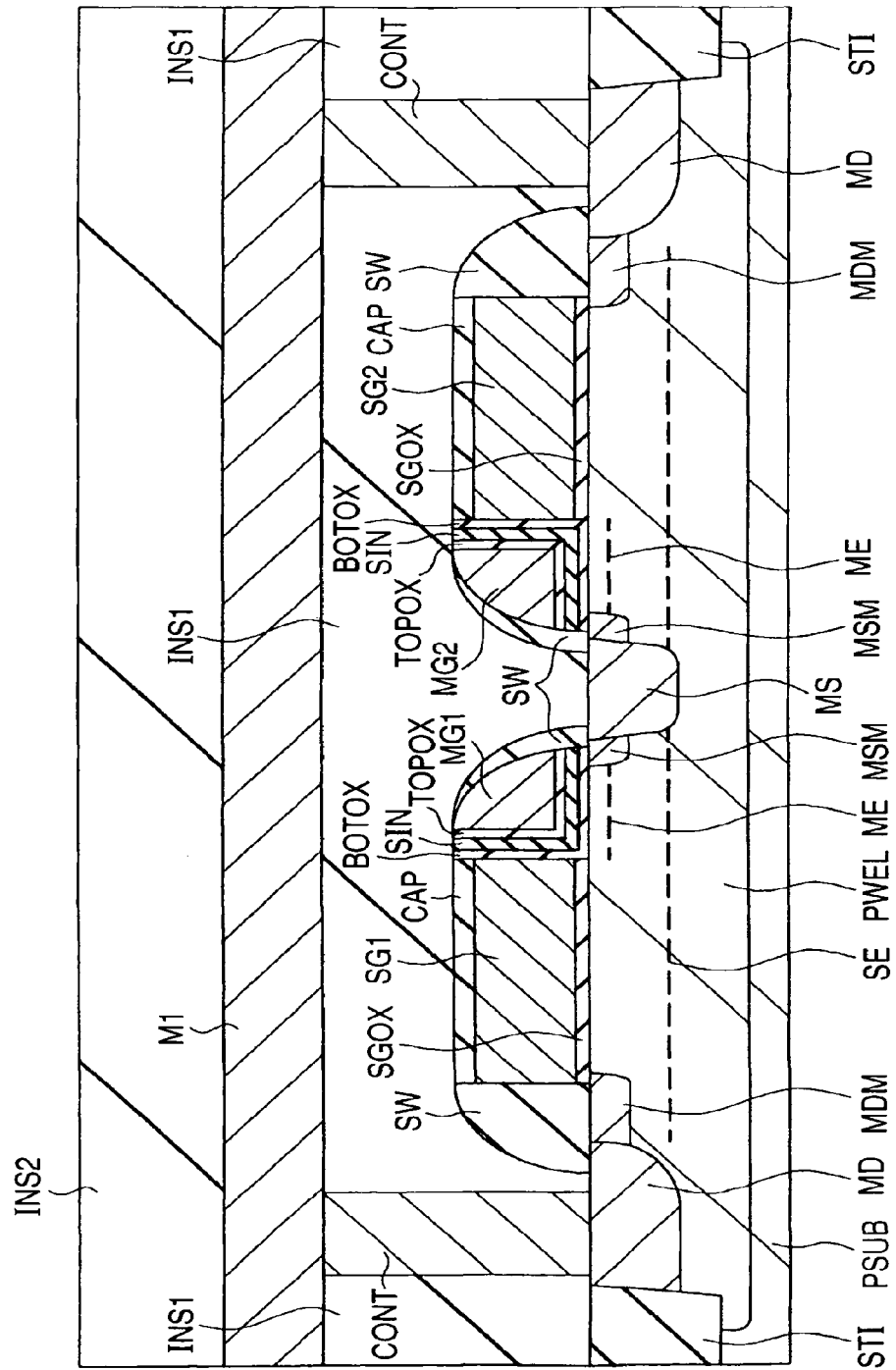
FIG. 24 is a cross-sectional view illustrating how to manufacture an essential part of a substrate of a nonvolatile semiconductor memory device according to one embodiment of the present invention.

Next, FIG. 24 will be used for description. Wiring interlayer insulation film INS1 is formed over the entire surface of the silicon substrate. The photolithography technique and dry etching technique are used to make a contact hole in the drain region MD and form a metal layer (plug) CONT in the contact hole. Subsequently, the photolithography technique and etching technique are used to form a first metal layer M1.

As illustrated in FIG. 5 and other figures, the memory gate MG and select gate SG are extended in a direction perpendicular to the paper surface and connected to the drain region MD. The first metal layer M1, which serves as a bit line BL, is extended in a direction orthogonal to those of the memory gate MG and select gate SG. In the circuit diagram shown in FIG. 13, the positions of the memory gate MG and select gate SG are interchanged.

Next, wiring interlayer insulation film INS2 is then formed. Although the subsequent steps are not illustrated in any figure, a contact hole is made in wiring interlayer insulation film INS2. Further, a conductive film is formed, and patterning is performed to form wiring. When the process for forming a wiring interlayer insulation film and wiring is repeatedly performed as described above, multilayer wiring can be formed.

Figure 25:
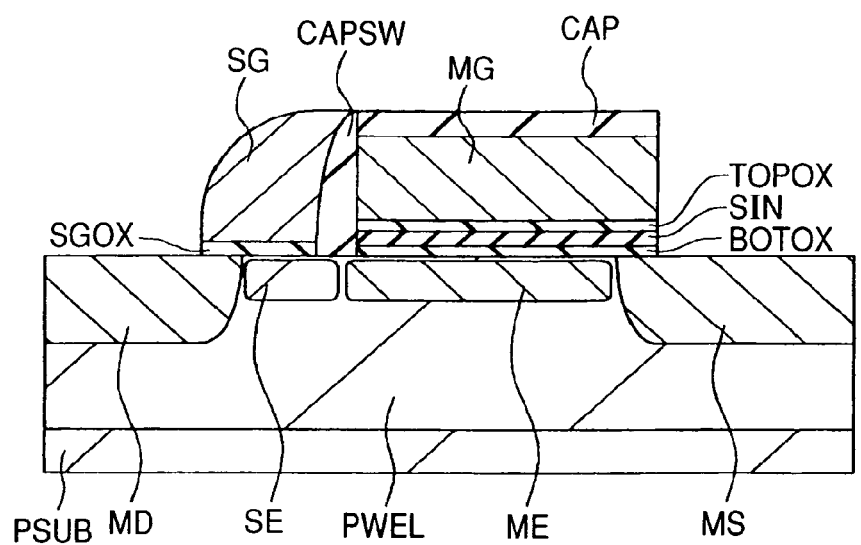
FIG. 25 is a cross-sectional view illustrating an essential part of another nonvolatile semiconductor memory device (flash memory) according to one embodiment of the present invention.
Figure 26:
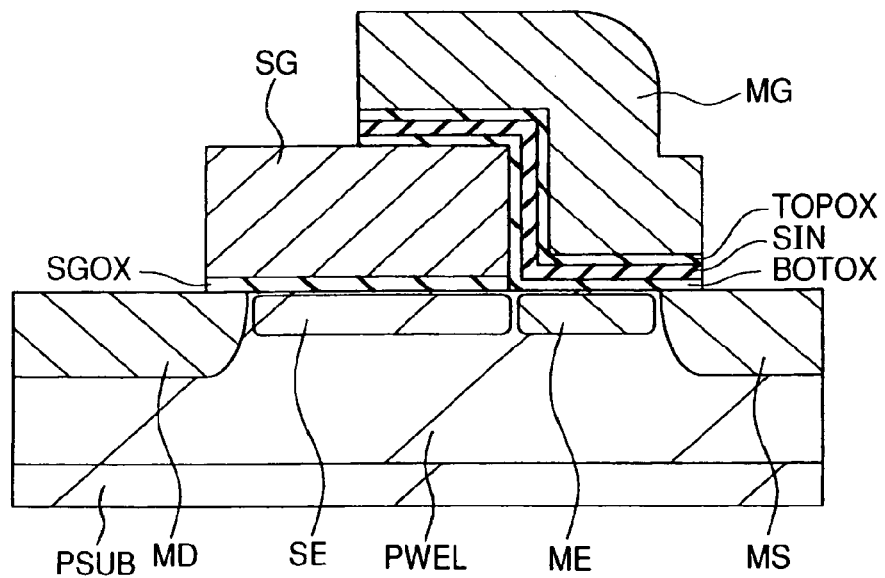
FIG. 26 is a cross-sectional view illustrating an essential part of another nonvolatile semiconductor memory device (flash memory) according to one embodiment of the present invention.
Figure 27:
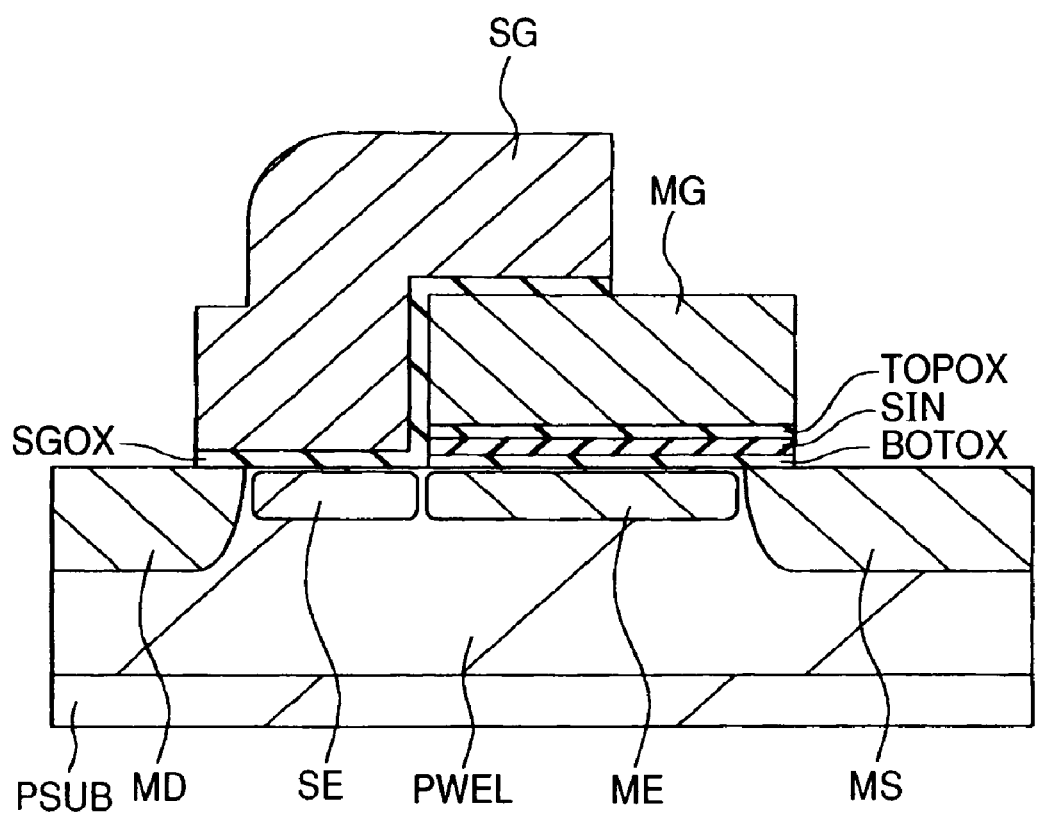
FIG. 27 is a cross-sectional view illustrating an essential part of another nonvolatile semiconductor memory device (flash memory) according to one embodiment of the present invention.

(7) Another typical memory cell structure for implementing the erase method according to the present invention will now be described with reference to FIGS. 25 through 27. FIGS. 25 through 27 are cross-sectional views illustrating an essential part of another nonvolatile semiconductor memory device (flash memory) according to the present embodiment.

FIG. 25 shows a memory cell in which the select gate SG is provided in the form of the sidewall spacer for the memory gate MG.

For the above memory cell, the memory transistor ONO film (BOPOX, SIN, and TOPOX) and memory gate MG are first formed, and then a sidewall spacer GAPSW, which comprises an insulator, is formed on the sidewall for the memory transistor ONO film and memory gate MG. The anisotropic etching technique is then used to form a select gate SG on the sidewall of the sidewall spacer GAPSW as is the case with the memory gate for the memory cell described with reference to FIG. 1 and other figures.

When the sidewall spacer GAPSW is formed with an oxide film whose thickness is greater than that of the select transistor gate insulator SGOX, the voltage-proofness between the memory gate MG and select gate SG improves.

Further, the processes for impurity injection into the memory transistor channel region (n-type doped region ME) and select transistor channel region SE are respectively performed before and after the formation of the memory gate MG.

FIG. 26 shows a memory cell in which the memory gate MG is positioned over the select gate SG.

For the above memory cell, the select gate SG is first formed, and then the ONO film and memory gate MG are formed by using the photolithography technique as is the case with the memory cell described with reference to FIG. 1 and other figures. The processes for impurity injection into the memory transistor channel region (n-type doped region ME) and select transistor channel region SE are performed in the same manner as described with reference to FIG. 18.

FIG. 27 shows a memory cell in which the select gate SG is positioned over the memory gate MG.

The above memory cell can be formed in the same manner as for the memory cell shown in FIG. 25 except that the photolithography technique is used to form the select gate SG. In other words, the select gate SG is formed after forming the ONO film and memory gate MG. The processes for impurity injection into the memory transistor channel region (n-type doped region ME) and select transistor channel region SE are respectively performed before and after the formation of the memory gate MG.

The memory cell structures shown in FIGS. 25 through 27 can be used to perform the same operation as the memory cell shown in FIG. 1 under the memory array and voltage conditions shown in FIGS. 5 through 15.

Further, the memory cell configuration for erase/read speed and high-temperature data retention reliability enhancement can also be applied to the memory cells shown in FIGS. 25 through 27 as described with reference to FIG. 16.

Figure 28:
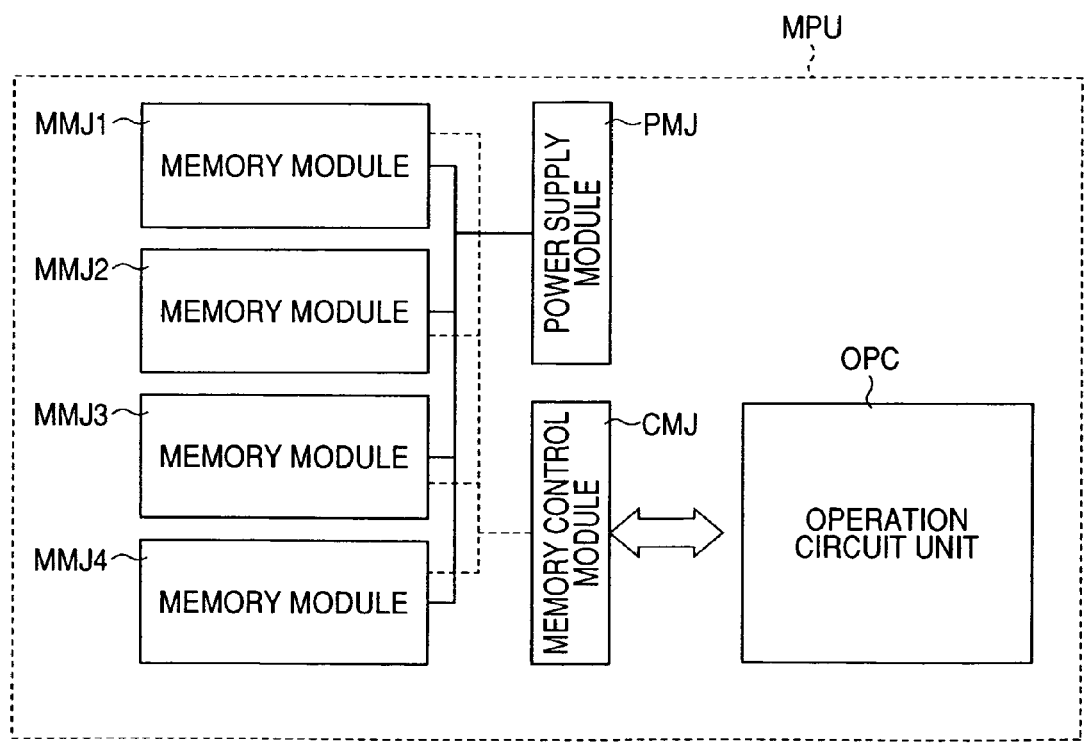
FIG. 28 is a schematic diagram illustrating a semiconductor chip that is formed, for instance, by incorporating a plurality of nonvolatile memory modules.

(8) It is conceivable that a plurality of nonvolatile memory modules may be integrated into a microprocessor chip in order not only for increasing the degree of memory integration but also for various other purposes. FIG. 28 is a block diagram that schematically illustrates a semiconductor chip MPU, which is formed by integrating a plurality of nonvolatile memory modules MMJ1-MMJ4 and the like into a single whole. A plurality of nonvolatile memory modules MMJ1-MMJ4 (MMJ1, MMJ2, MMJ3, MMJ4), a memory control module CMJ for controlling the nonvolatile memory modules MMJ1-MMJ4, a power supply module PMJ for supplying predetermined potentials to the nonvolatile memory modules MMJ1-MMJ4, and an operation circuit unit OPC are integrated into the semiconductor chip MPU shown in FIG. 28. When the plurality of nonvolatile memory modules MMJ1-MMJ4 are integrated into a single semiconductor chip MPU, it is conceivable that the memory cells of the individual modules (MMJ1-MMJ4) may be differently used. The present embodiment can change the operation characteristics of the nonvolatile memory modules without changing the structures of their memory cells. It is therefore possible to apply the method (programming/erasing method) according to the foregoing embodiment to relevant nonvolatile memory modules only while applying a conventional method (programming/erasing method) to the other nonvolatile memory modules integrated into the semiconductor chip MPU. In other words, the method according to the foregoing embodiment can be applied to relevant nonvolatile memory modules only while the other nonvolatile memory modules operate in a conventional manner in a situation where all the nonvolatile memory modules are integrated into a single chip.

In the present embodiment, the silicon nitride film (charge trap type insulator) is used as the memory cell charge storage film. Alternatively, however, an oxidized silicon nitride film, tantalum oxide film, aluminum oxide film, or other charge trap type insulator may be used instead of the silicon nitride film.

As a charge storage layer, fine grains (dots) comprising a conductive material such as polysilicon may be used. The dots are obtained, for instance, by depositing a plurality of polysilicon grains on the bottom oxide. The top oxide is formed over the dots so that the individual dots are insulated from each other. When these dots are used, the charges (electrons) stored within the dots do not readily move between the dots. Therefore, the aforementioned effect can be achieved by aligning the electron injection position with the hole injection position. The dots are applicable to the memory cells shown in FIGS. 25 through 27. When the dots are used, it is preferred that their diameters be not larger than 10 nm. An insulation film is formed between the dots to discretely store charges.

If a single conductive floating gate is used, electrons and holes can move with it. Therefore, the effect achieved by aligning the electron injection position with the hole injection position is small.

While the present invention has been described in conjunction with presently preferred embodiments of the invention, persons of skill in the art will appreciate that variations may be made without departure from the scope and spirit of the invention.

The present invention can be applied to a nonvolatile semiconductor memory device.

What is claimed is:

1. A nonvolatile semiconductor memory device comprising:
   an array of a plurality of memory cells, each of the memory cells including:
   (a) a first semiconductor region and a second semiconductor region, which are formed in a semiconductor substrate;
   (b) a first conductor and a second conductor, which are formed over the semiconductor substrate between the first semiconductor region and the second semiconductor region;
   (c) a first insulator formed between the first conductor and the semiconductor substrate; and
   (d) a second insulator, which is formed between the second conductor and the semiconductor substrate and provided with an internal charge storage section,
   (e) wherein a plurality of first lines and second lines are included, each first line connecting the first conductors of memory cells arranged in a first direction, and each second line connecting the first semiconductor regions positioned on the first conductor side of memory cells arranged in a second direction, which is perpendicular to the first direction,
   (f) wherein an erase operation is performed by injecting first carriers, which have a first polarity that is either positive or negative and are generated by band-to-band tunneling, into the charge storage section of a selected memory cell while a potential having the first polarity is applied to the first line that is connected to the selected memory cell, and
   wherein, when the first-carrier injection is performed, second carriers, which flow between the first and second semiconductor regions of the selected memory cell and have a second polarity that is opposite the first polarity, are injected into the charge storage section of the selected memory cell.

2. The nonvolatile semiconductor memory device according to claim 1,
   wherein, if the first semiconductor region and the second semiconductor region are n-type semiconductor regions, the first polarity is a positive polarity and the first carriers are holes, and wherein, if the first semiconductor region and the second semiconductor region are p-type semiconductor regions, the first polarity is a negative polarity and the first carriers are electrons.

3. The nonvolatile semiconductor memory device according to claim 1, wherein the first-carrier injection is performed while a current flows between the first and second semiconductor regions of the selected memory cell.

4. The nonvolatile semiconductor memory device according to claim 1, wherein the first carriers are holes and the second carriers are electrons.

5. The nonvolatile semiconductor memory device according to claim 1, wherein the second carriers are injected into the charge storage section near an end of the second conductor.

6. The nonvolatile semiconductor memory device according to claim 1, wherein a programming operation is performed by storing second carriers near an end of the first conductor associated with the second insulator of a memory cell that is selected for programming, the second carriers flowing between the first and second semiconductor regions of the memory cell selected for programming and having the second polarity.

7. The nonvolatile semiconductor memory device according to claim 1, wherein the erase operation is performed by:
(f1) applying a first potential to the first line connected to the selected memory cell;
(f2) applying a second potential to another first line of the plurality that is not connected to the selected memory cell;
(f3) applying a third potential to the second line connected to the selected memory cell; and
(f4) applying a fourth potential to another second line of the plurality that is not connected to the selected memory cell,
(f5) wherein the third potential is lower than the first potential and equal to or higher than the second potential, and
wherein the fourth potential is equal to or higher than the first potential and equal to or higher than the second potential.

8. The nonvolatile semiconductor memory device according to claim 1, further comprising:
(g) a plurality of third lines, which connect to the second semiconductor regions of the memory cells arranged in the first direction and are interconnected in predefined sets.

9. The nonvolatile semiconductor memory device according to claim 1, further comprising:
(g) a plurality of third lines, which connect to second conductors of the memory cells arranged in the first direction and are interconnected in predefined sets.

10. A nonvolatile semiconductor memory device comprising:
an array of a plurality of memory cells, each of the memory cells including:
(a) a first semiconductor region and a second semiconductor region, which are formed in a semiconductor substrate;
(b) a first conductor and a second conductor, which are formed over the semiconductor substrate between the first semiconductor region and the second semiconductor region;
(c) a first insulator formed between the first conductor and the semiconductor substrate; and
(d) a second insulator, which is formed between the second conductor and the semiconductor substrate and provided with an internal charge storage section, (e) wherein a plurality of first lines, second lines, and third lines are included, each first line connecting the first conductors of memory cells arranged in a first direction, each second line connecting the second semiconductor regions positioned on the second conductor side of memory cells arranged in a second direction, which is perpendicular to the first direction, and each third line connecting the first semiconductor regions of the memory cells arranged in the first direction,
(f) wherein an erase operation is performed by injecting first carriers, which have a first polarity that is either positive or negative and are generated by band-to-band tunneling, into the charge storage section of a selected memory cell while a potential having the first polarity is applied to the first line that is connected to the selected memory cell, and
wherein, when the first-carrier injection is performed, second carriers, which flow between the first and second semiconductor regions of the selected memory cell and have a second polarity that is opposite the first polarity, are injected into the charge storage section of the selected memory cell.

11. The nonvolatile semiconductor memory device according to claim 10,
wherein, if the first semiconductor region and the second semiconductor region are n-type semiconductor regions, the first polarity is a positive polarity and the first carriers are holes, and
wherein, if the first semiconductor region and the second semiconductor region are p-type semiconductor regions, the first polarity is a negative polarity and the first carriers are electrons.

12. The nonvolatile semiconductor memory device according to claim 10, wherein the first-carrier injection is performed while a current flows between the first and second semiconductor regions of the selected memory cell.

13. The nonvolatile semiconductor memory device according to claim 10, wherein the first carriers are holes and the second carriers are electrons.

14. The nonvolatile semiconductor memory device according to claim 10, wherein the second carriers are injected into the charge storage section near an end of the second conductor.

15. The nonvolatile semiconductor memory device according to claim 10, wherein a programming operation is performed by storing second carriers near an end of the first conductor associated with the second insulator of a memory cell that is selected for programming, the second carriers flowing between the first and second semiconductor regions of the memory cell selected for programming and having the second polarity.

16. The nonvolatile semiconductor memory device according to claim 10, wherein the erase operation is performed by:
(f1) applying a first potential to the first line connected to the selected memory cell;
(f2) applying a second potential to another first line of the plurality that is not connected to the selected memory cell;
(f3) applying a third potential to the third line connected to the selected cell; and
(f4) applying a fourth potential to another third line of the plurality that is not connected to the selected memory cell,
(f5) wherein the third potential is lower than the first potential and equal to or higher than the second potential, and wherein the fourth potential is equal to or higher than the first potential and equal to or higher than the second potential.

17. The nonvolatile semiconductor memory device according to claim 10, wherein the plurality of third lines are interconnected in predefined sets.

18. The nonvolatile semiconductor memory device according to claim 10, further comprising:
(g) a plurality of fourth lines, which connect to second conductors of the memory cells arranged in the first direction and are interconnected in predefined sets.

19. A nonvolatile semiconductor memory device comprising:
(a) a first semiconductor region and a second semiconductor region, which are formed in a semiconductor substrate;
(b) a first conductor and a second conductor, which are formed over the semiconductor substrate between the first semiconductor region and the second semiconductor region, the first conductor being positioned on the first semiconductor region side, the second conductor being positioned on the second semiconductor region side;
(c) a first insulator formed between the first conductor and the semiconductor substrate; and
(d) a second insulator, which is formed between the second conductor and the semiconductor substrate and provided with an internal charge storage section,
wherein, when a programming operation is to be performed, (e) electrons are injected into the charge storage section by applying a positive potential to the second conductor, applying a positive potential to the second semiconductor region, and applying a positive potential to the first conductor; and
(f) electrons are injected into the charge storage section by applying a positive potential to the second conductor, applying a potential of 0 V or a potential lower than the potential for the second conductor to the second semiconductor region, and applying a potential equal to or lower than the potential for the first semiconductor region to the first conductor.

20. A nonvolatile semiconductor memory device comprising:
(a) a first semiconductor region and a second semiconductor region, which are formed in a semiconductor substrate;
(b) a first conductor and a second conductor, which are formed over the semiconductor substrate between the first semiconductor region and the second semiconductor region, the first conductor being positioned on the first semiconductor region side, the second conductor being positioned on the second semiconductor region side;
(c) a first insulator formed between the first conductor and the semiconductor substrate; and
(d) a second insulator, which is formed between the second conductor and the semiconductor substrate and provided with an internal charge storage section,
wherein, when an erase operation is to be performed, (e) holes are injected into the charge storage section by applying a negative potential to the second conductor, applying a positive potential to the second semiconductor region, and applying a positive potential to the first conductor; and
wherein (f) electrons are injected into the charge storage section by applying a positive potential to the second conductor, applying a potential of 0 V or a potential lower than the potential for the second conductor to the second semiconductor region, and applying a potential equal to or lower than the potential for the first semiconductor region to the first conductor.

* * * * *